(12) United States Patent
Lee et al.

(10) Patent No.: US 11,625,843 B2
(45) Date of Patent: Apr. 11, 2023

(54) SYSTEMS AND METHODS FOR AUTOMATIC ALIGNMENT OF DRAWINGS

(71) Applicant: Bluebeam, Inc., Pasadena, CA (US)

(72) Inventors: Jae Min Lee, Fullerton, CA (US); Joseph W. Wezorek, Pasadena, CA (US)

(73) Assignee: Bluebeam, Inc., Pasadena, CA (US)

( * ) Notice: Subject to any disclaimer, the term of this patent is extended or adjusted under 35 U.S.C. 154(b) by 358 days.

(21) Appl. No.: 16/910,175

(22) Filed: Jun. 24, 2020

(65) Prior Publication Data

US 2021/0407111 A1 Dec. 30, 2021

(51) Int. Cl.
| | |
|---|---|
| *G06T 7/33* | (2017.01) |
| *G06F 16/22* | (2019.01) |
| *G06F 30/13* | (2020.01) |
| *G06T 3/00* | (2006.01) |

(52) U.S. Cl.
CPC ............ *G06T 7/33* (2017.01); *G06F 16/2255* (2019.01); *G06F 30/13* (2020.01); *G06T 3/0006* (2013.01)

(58) Field of Classification Search
CPC ... G06F 16/2255; G06F 30/13; G06T 3/0006; G06T 7/33
See application file for complete search history.

(56) References Cited

U.S. PATENT DOCUMENTS

| 8,660,383 B1* | 2/2014 | Callari ................. G06V 10/751 |
| | | 382/113 |
| 9,998,663 B1* | 6/2018 | François ............ H04N 5/23267 |
| 2005/0238198 A1 | 10/2005 | Brown et al. |
| 2010/0020167 A1* | 1/2010 | Zandifar ................... G06T 7/33 |
| | | 348/E5.022 |
| 2011/0091065 A1 | 4/2011 | Chandrashekar et al. |
| 2015/0347671 A1 | 12/2015 | Kiff et al. |
| 2016/0086048 A1* | 3/2016 | Lee ........................ G06V 10/44 |
| | | 382/201 |
| 2016/0379041 A1* | 12/2016 | Rhee ................... G06V 40/165 |
| | | 382/118 |
| 2018/0033155 A1* | 2/2018 | Jia ........................... G06T 7/337 |
| 2018/0158199 A1* | 6/2018 | Wang .................. G06V 40/167 |
| 2018/0247147 A1 | 8/2018 | Polidor et al. |
| 2020/0193116 A1* | 6/2020 | Chen .................. G06V 40/1376 |
| 2021/0125363 A1* | 4/2021 | Barish ..................... G06T 15/08 |

OTHER PUBLICATIONS

International Search Report dated Sep. 30, 2021, in counterpart International Patent Application No. PCT/US21/38375 (2 pages, in English).

* cited by examiner

*Primary Examiner* — Phi Hoang
(74) *Attorney, Agent, or Firm* — Bookoff McAndrews, PLLC

(57) ABSTRACT

Systems and methods are disclosed for automatically aligning drawings. One method comprises receiving a source drawing and a target drawing, determining main axes of the source and target drawings respectively, and aligning the main axis of the source drawing to the main axis of the target drawing. A plurality of source feature point vectors and target feature point vectors may be generated from the source and target drawings, whose main axes have been aligned. A predetermined number of matching FPV pairs may then be determined across the source and target drawings, and the source drawing may be aligned with the target drawings based on the matching FPV pairs.

18 Claims, 16 Drawing Sheets

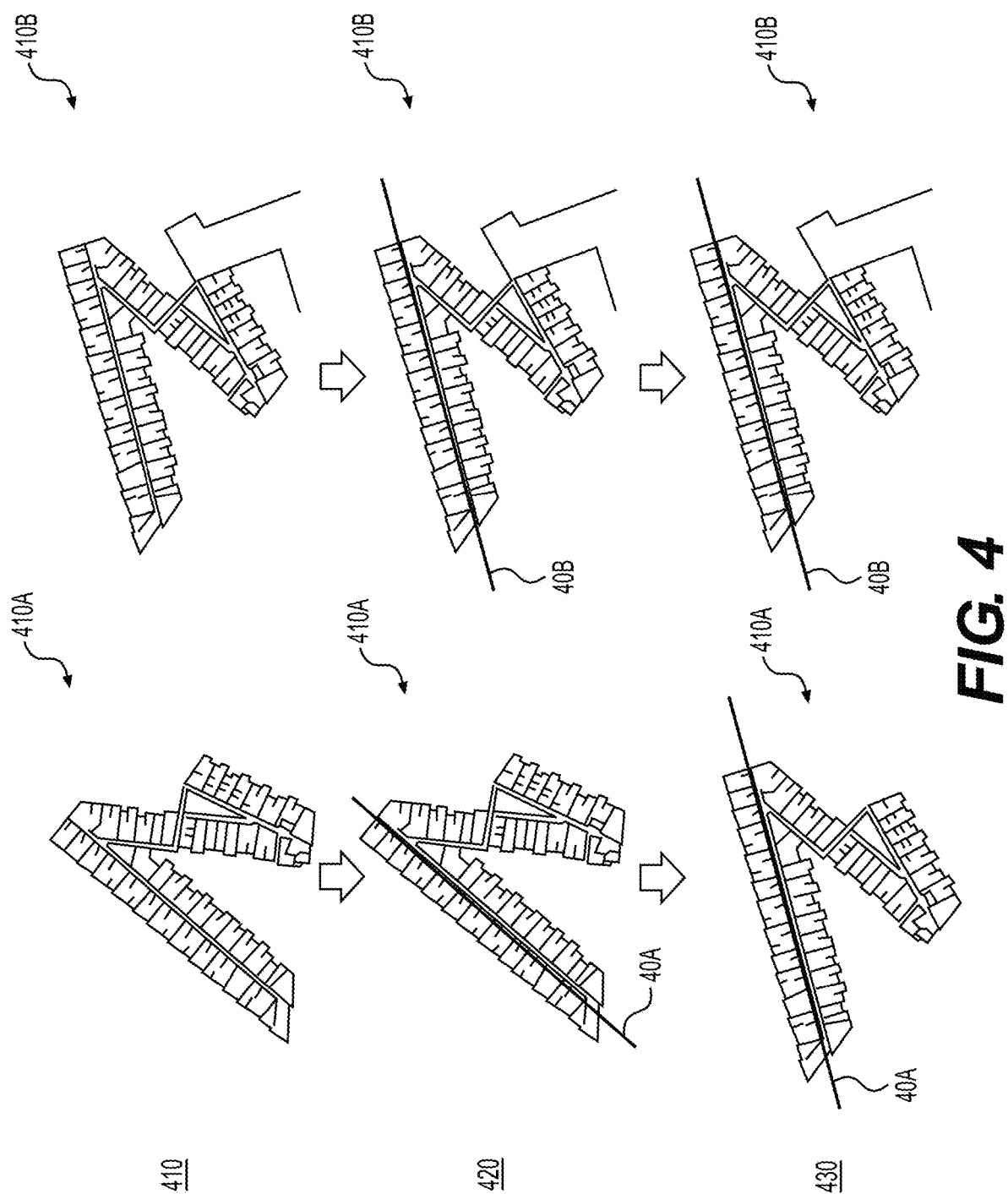

SYSTEMS AND METHODS FOR AUTOMATIC ALIGNMENT OF DRAWINGS

TECHNICAL FIELD

The present disclosure relates to systems and methods for automatically aligning drawings. More particularly, the present disclosure relates to systems and methods for automatically aligning drawings represented in digital format, based on feature point vectors generated from the drawings.

BACKGROUND

Architecture, engineering, and construction (AEC) industries actively use drawings to represent building designs. A large number of drawings are usually needed to represent various aspects of a building. Oftentimes, multiple drawings of varying scales and scopes may be generated with respect to a single location. Alignment of these drawings may be important to ensure consistency in positioning building elements such as, e.g., columns, walls, etc., and validating constructability of all building elements through different levels and disciplines.

The background description provided herein is for the purpose of generally presenting the context of the disclosure. Unless otherwise indicated herein, the materials described in this section are not prior art to the claims in this application and are not admitted to be prior art, or suggestions of the prior art, by inclusion in this section.

SUMMARY OF THE DISCLOSURE

One embodiment provides a computer-implemented method for automatically aligning drawings, comprising: receiving a source drawing and a target drawing; determining a main axis of the source drawing and a main axis of the target drawing; aligning the main axis of the source drawing to the main axis of the target drawing; generating a plurality of source feature point vectors (FPVs) from the source drawing and a plurality of target FPVs from the target drawing; determining a predetermined number of matching FPV pairs across the source drawing and the target drawing; and aligning the source drawing with the target drawing based on the matching FPV pairs.

Another embodiment provides a system for automatically aligning drawings. The system may comprise one or more processors; and at least one non-transitory computer readable medium storing instructions which, when executed by the one or more processors, cause the one or more processors to perform operations comprising: receiving a source drawing and a target drawing; determining a main axis of the source drawing and a main axis of the target drawing; aligning the main axis of the source drawing to the main axis of the target drawing; generating a plurality of source feature point vectors (FPVs) from the source drawing and a plurality of target FPVs from the target drawing; determining a predetermined number of matching FPV pairs across the source drawing and the target drawing; and aligning the source drawing with the target drawing based on the matching FPV pairs.

Another embodiment provides at least one non-transitory computer readable medium for automatically aligning drawings. The at least one non-transitory computer readable medium may store instructions which, when executed by one or more processors, cause the one or more processors to perform operations comprising: receiving a source drawing and a target drawing; determining a main axis of the source drawing and a main axis of the target drawing; aligning the main axis of the source drawing to the main axis of the target drawing; generating a plurality of source feature point vectors (FPVs) from the source drawing and a plurality of target FPVs from the target drawing; determining a predetermined number of matching FPV pairs across the source drawing and the target drawing; and aligning the source drawing with the target drawing based on the matching FPV pairs.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
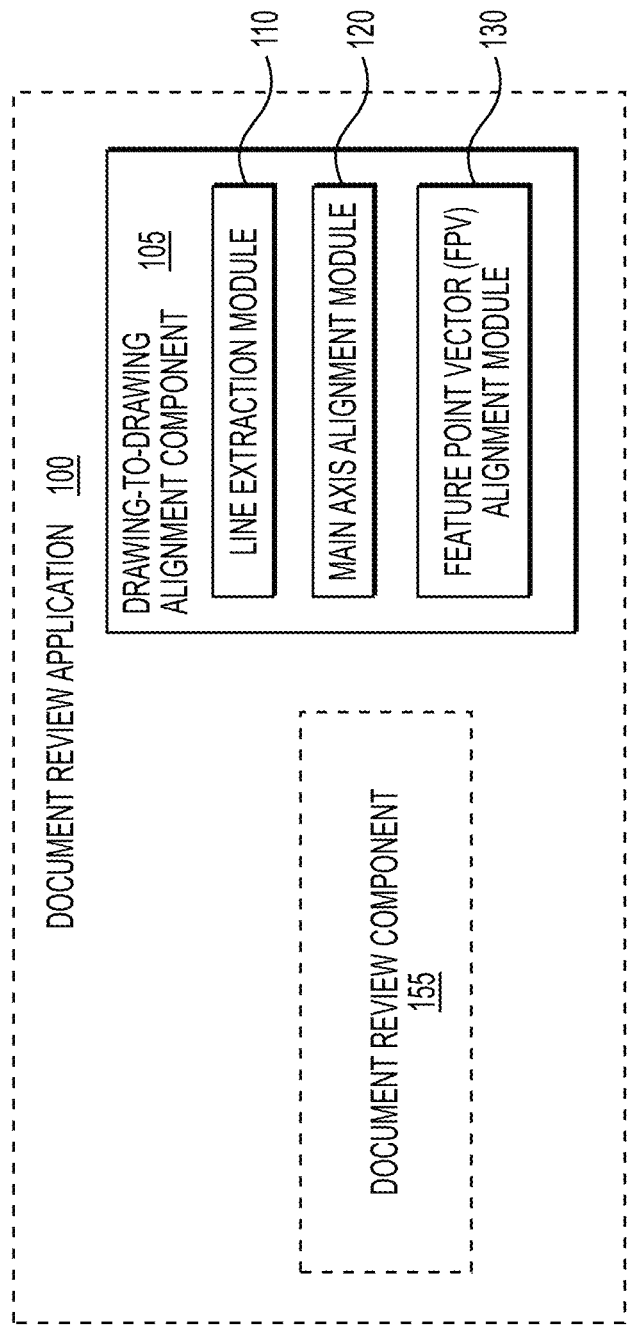
FIG. 1 shows a block diagram of an exemplary document review application, according to one aspect of the present disclosure.

The following embodiments describe systems and methods for automatically aligning drawings and, more particularly, for automatically aligning drawings represented in digital formal based on feature point vectors generated from the drawings.

In the AEC industry, multiple drawings directed to a same geographical or building location may need to be aligned in order to ensure consistency in the positioning and validating constructability of architectural elements. Currently, such alignment is performed manually by, for example, determining locations of overlap after establishing a consistent scale among the drawings. The manual process may be tedious and time-consuming, especially when there are a large number of drawings to be validated. Further, AEC drawings may be highly schematic, and may depict partial features of architectural components at varying scales across documents or even within a single document. Aligning drawings of varying scales, boundaries, and/or orientations may be more complicated than aligning drawings having the same scales, boundaries, and/or orientations.

Therefore, there is a need for systems and methods enabling more effective and expeditious drawing alignment. Further, there is a need for systems and methods enabling automatic alignment between drawings of varying scales, scopes, and/or orientations, such as between full and partial drawings, or among partial drawings.

The present disclosure concerns systems and methods for automatically aligning drawings directed at least partially to a same geographical or building location. In one embodiment, a source drawing and a target drawing may be selected and line segments of the source and target drawings may be determined. Main axes of the source and target drawings may be determined based on these line segments, using angle barcode techniques. Once the main axes have been determined, the main axis of the source drawing may be aligned with the main axis of the target drawing, by rotating the source drawing until the main axis of the source drawing becomes aligned with the main axis of the target drawing. Feature point vectors (FPVs) may then be extracted from the source and target drawings, and may be matched across the source and target drawings until a predetermined number of matching FPV pairs are found. Techniques for accelerating the matching process and saving computational resources are disclosed, such as, e.g., storing of FPVs in a three-dimensional (3D) hashing table for faster matching, reducing a local search domain of FPVs processed for matching while sustaining matching accuracy, etc. Upon finding a predetermined number of matching FPV pairs, the source drawing may be aligned with the target drawing, or may be mapped to the target drawing based on a transformation matrix generated from the matching FPV pairs.

The subject matter of the present disclosure will now be described more fully hereinafter with reference to the accompanying drawings, which form a part hereof, and which show, by way of illustration, specific exemplary embodiments. An embodiment or implementation described herein as "exemplary" is not to be construed as preferred or advantageous, for example, over other embodiments or implementations; rather, it is intended to reflect or indicate that the embodiment(s) is/are "example" embodiment(s). Subject matter may be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof. The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of exemplary embodiments in whole or in part.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. It should also be noted that all numeric values disclosed herein may have a variation of ±10% (unless a different variation is specified) from the disclosed numeric value. Further, all relative terms such as "about," "substantially," "approximately," etc. are used to indicate a possible variation of ±10% (unless noted otherwise or another variation is specified).

Referring now to the appended drawings, FIG. 1 shows a block diagram of an exemplary document review application, according to one aspect of the present disclosure. The document review application 100 may be installed on a computing device consistent with or similar to that depicted in FIG. 15. In general, the document review application 100 may comprise a document review component 155 and a drawing-to-drawing alignment component 105.

The document review component 155 may enable a user to locate a design document from a local or remote storage, open and make modifications to the design document (e.g., add, remove, or modify drawings, annotations, markups, etc. in the design document), save the modified design document in a local or remote storage, delete the design document, collaborate with other users synchronously or asynchronously to review/edit the design document, etc. In one embodiment, the document review component 155 may be a PDF document reviewing/editing software component. However, in other embodiments, the document review component 155 may be a document reviewing/editing software component also compatible with other types of files such as, e.g., Building Information Modeling (BIM) files, word processing documents, Computer-Aided Design (CAD) drawings, image files, etc. The documents reviewed using the document review component 155 may include, but may not be limited to, architectural drawings, engineering drawings, and construction drawings (i.e., documents frequently used in the AEC industry).

Figure 2:
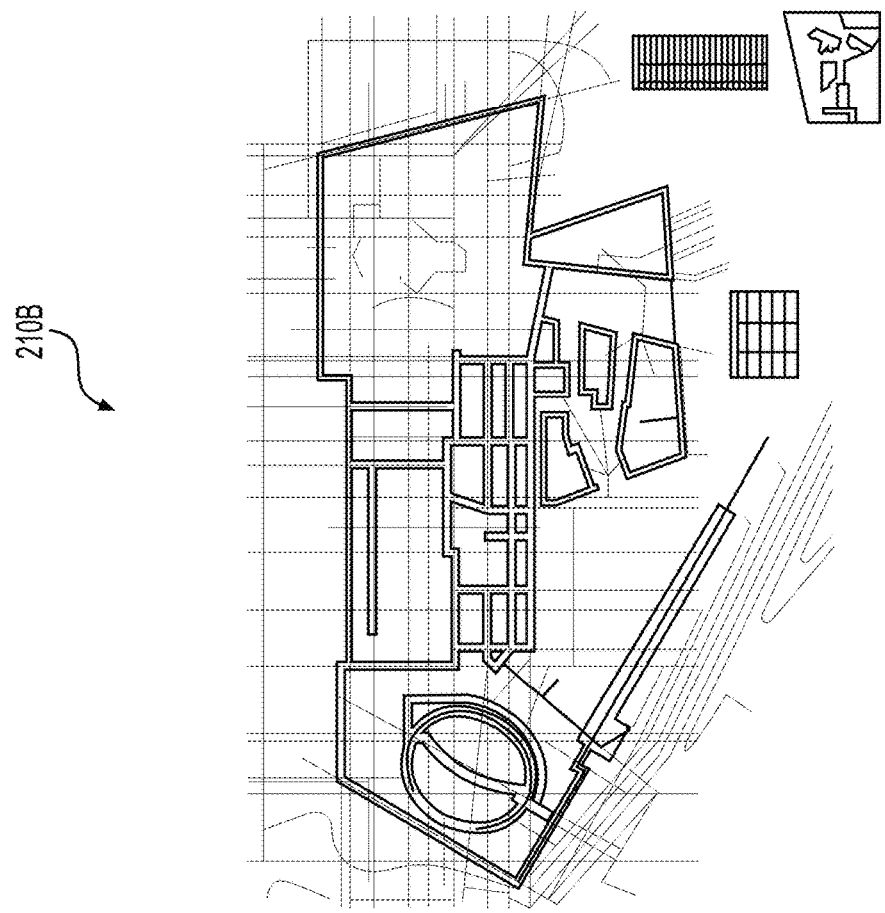
FIG. 2 shows an exemplary source drawing and an exemplary target drawing, to illustrate the drawings may have varied scales, scopes, and orientations while being directed to a same geographical or building location.
Figure 2:
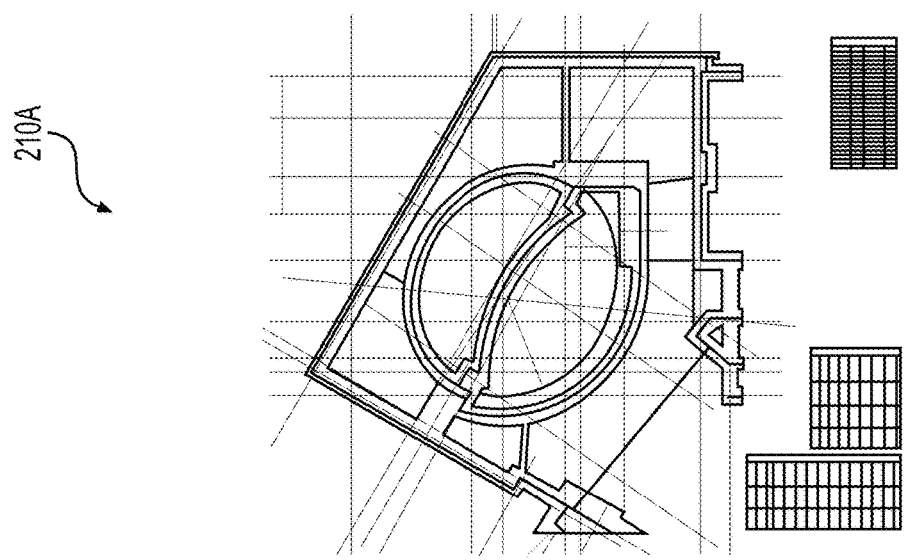

The drawing-to-drawing alignment component 105 may establish alignment between a source drawing and a target drawing. In one embodiment, a design document may comprise just one drawing. In other embodiments, a design document may comprise a plurality of drawings, each of which may be designated as a source drawing or a target drawing. As explained above, to validate consistency among multiple drawings related to a same geographical or building location, the drawing-to-drawing alignment component 105 may be configured to align drawings (i.e., a source drawing and a target drawing) of varying scales, scopes, and/or orientations without user intervention or with minimal user intervention (e.g., selection of a source/target drawing). For example, FIG. 2 illustrates a source drawing 210A and a target drawing 210B, which have varied scales, scopes, and orientations while being directed to a same building location (i.e., the building location illustrated in the source drawing 210A). Notably, the target drawing 2106 appears to have a smaller scale and a larger scope relative to those of the source drawing 210A. The drawings 210A and 2106 are also oriented differently. The drawing-to-drawing alignment component 105 of the present disclosure may process drawings such as the ones illustrated in FIG. 2 and automatically align the drawings for further validation by a user or a computing system.

The drawing-to-drawing alignment component 105 may comprise a line extraction module 110, a main axis alignment module 120, and a feature point vector (FPV) alignment module 130. While techniques discussed herein may refer to various steps being performed by different modules, such as the line extraction module 110, main axis alignment module 120, and FPV alignment module 130, such steps may be performed by any module or software component discussed herein, on one or multiple computers, may be performed by one or across multiple devices, and/or within a single or across multiple software applications.

The line extraction module 110 may extract line segments constituting a drawing from a design document. The basis of the line extraction module 110 example described herein (i.e., in reference to FIG. 3) assumes that drawings are commonly represented digitally in PDF format and that the content salient to matching two or more drawings is encoded as path drawing commands rather than as embedded raster images. However, drawings from other types of documents and lines extracted therefrom can be processed using the drawing alignment techniques contemplated herein.

In one embodiment, the line extraction module 110 may reduce a design document or a portion of a design document comprising a drawing to a flat list of line segments to simplify processing. For instance, the line extraction module 110 may interpret drawing commands in the design document as a typical design document rendering library (e.g., a PDF rendering library) would. However, instead of rasterizing the drawing commands, a subset (e.g., a path drawing) may be processed through a finite state transducer, which may be configured to output line segments transformed appropriately given a current drawing state.

Figure 3:
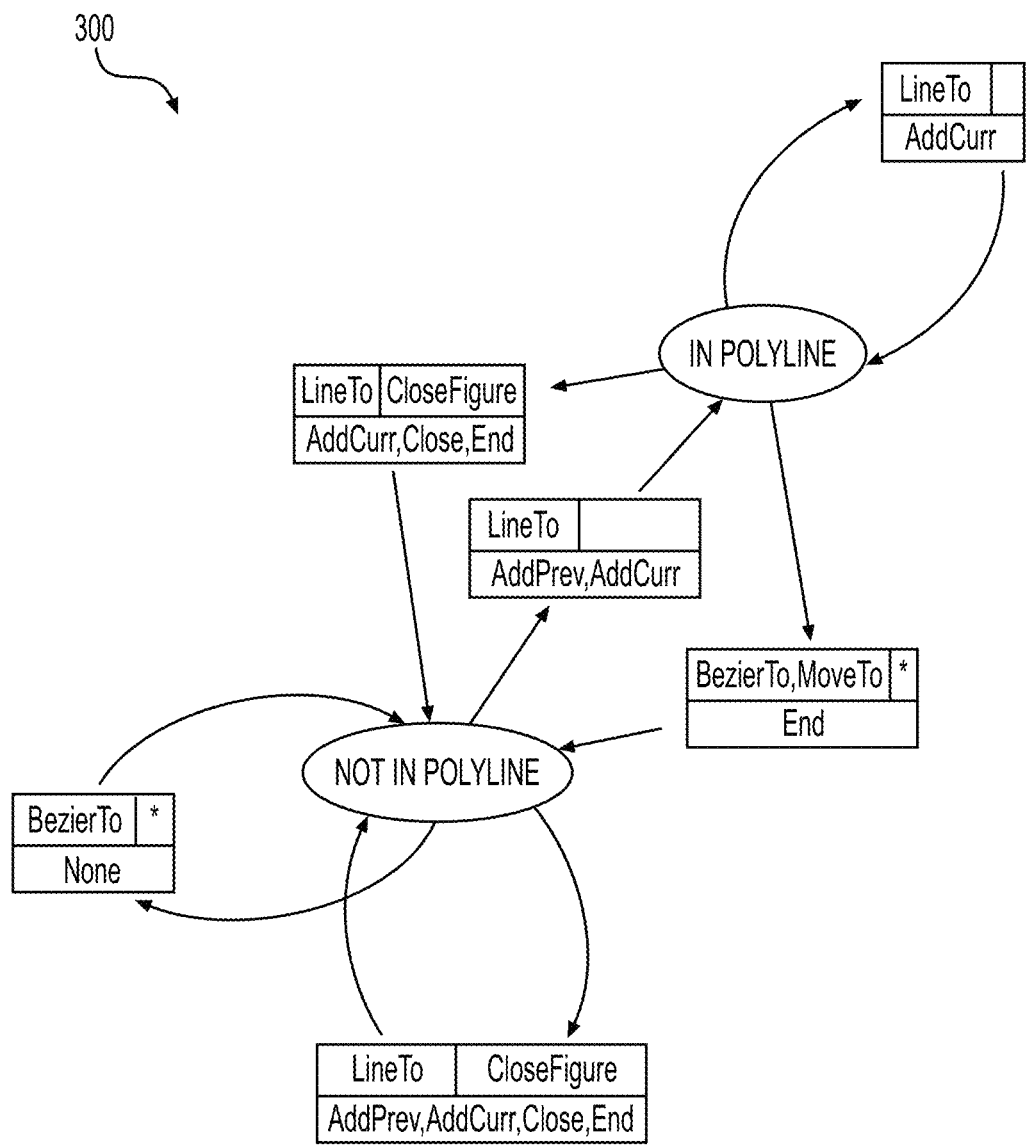
FIG. 3 illustrates an exemplary finite state transducer, according to one aspect of the present disclosure.

An exemplary finite state transducer is depicted in FIG. 3. The transducer 300 may take path drawing commands as input and may output lists of points representing chains of line segments (i.e., polylines). The transducer 300 may be in one of two states (e.g., "In polyline" or "Not in polyline" illustrated in FIG. 3), representing whether a path drawing command actively declares a line segment to be drawn. As each path point and drawing command is interpreted, the transducer 300 may change states base on its current state, a path operator issued (e.g., PDF path operators "I," "m," and "c" or "v" referred to as "LineTo," "MoveTo," and "BezierTo" in FIG. 3), and whether a close path operator is issued before a next point (e.g., PDF path operator "h" referred to as "CloseFigure" in FIG. 3). For each transition, the transducer 300 may perform one or more of the following semantic actions: add a previous point to a current polyline (i.e., a current chain of line segments), add a current point to a current polyline, close a current polyline by adding the current polyline's first point to its end, and/or end a current polyline by exporting it as an output and clearing it locally.

Referring back to FIG. 1, upon extracting line segments, the line extraction module 110 may exclude line segments that are likely noise. For example, a line segment that is totally contained by another line segment may be elided or merged with the other line segment. The line extraction module 110 may further filter the remaining line segments by the size of the cluster containing each of them. A cluster may comprise a set of line segments that share at least one end point. A cluster size may be measured by the sum of the lengths of the line segments in the cluster, or the maximum dimension of the non-axis-aligned rectangle containing the cluster.

The main axis alignment module 120 may perform rotation of a source drawing or a target drawing, such that the source and target drawings share the same main axis. To that end, the main axis alignment module 120 may utilize an angle barcode technique. Angle barcode is a barcode-like description of all the angles of line segments that appear in a drawing, in the range of 0 to 180 degrees. An angle barcode technique may utilize two types of angle barcodes. First, an angle-count barcode may be used to represent a drawing's distribution of line angles and their respective line counts. Second, an angle-length barcode may be used to represent a drawing's distribution of line angles and their respective total line lengths. An angle that has the maximum value based on one or both of these representations may define the main axis. Once the main axis has been determined, one of the source and target drawings may be rotated until the main axis of the rotated drawing becomes aligned with the main axis of the other drawing. Techniques for determining a main axis of a drawing, including angle barcode generation, will be explained in greater detail below.

With continuing reference to FIG. 1, the FPV alignment module 130 may perform transformation of a source drawing or a target drawing, such that the source and target drawings come in alignment with each other. To accomplish this, the FPV alignment module 130 may process FPVs through several stages. First, the FPV alignment module 130 may extract FPVs from the source drawing and the target drawing. A key datum carrying a semantic value in a drawing is a corner point, which is a point at which two line segments intersect. A corner point may thus be referred to as an intersection point. An intersection point and two vectors radiating outward from the intersection point along the line segments may be defined as an FPV (e.g., FIG. 8). Using the FPVs, two drawings may be matched and aligned by finding the matching FPVs across the drawings. The angles of each FPV (i.e., the angles of the vectors in the counter clockwise direction from a horizontal line) may be used as an identity value or a type for that FPV. Such angles associated with an FPV may thus be referred to as identity angles of an FPV. In one embodiment, FPVs extracted from a target drawing may be stored in a 3D hashing table to achieve processing efficiency at a later stage.

The FPV alignment module 130 may then sort or order the FPVs extracted from the source drawing based on the type of each FPV. As explained above, a type associated with an FPV (i.e., an FPV type) may be represented by the identity angles of the FPV. More particularly, the FPVs extracted from the source drawing may be ordered from the rarest type (i.e., the least common type) to the most common type. The degree of rarity associated with an FPV may be determined based on the number of FPVs associated with its FPV type (i.e., the number of FPVs having the same identity angles as the FPV). In other words, the fewer FPVs there are having the same identity angles as an FPV, the rarer the FPV is. When the FPVs across the source and target drawings are matched, the rarest FPVs (i.e., the least common FPVs) may be processed first until a predetermined number (e.g., three) of matching FPV pairs are found.

A transformation matrix mapping one drawing to another may be calculated based on the matching FPV pairs. If each drawing has n points, the total number of possible matching pairs may be $_nC_3 \times _nC_3$. Thus, assuming that the number of points in a drawing (i.e., n) can be greater than 10,000, a complete brute-force search for three matching FPV pairs may be intractable and computationally expensive. Therefore, the search space may be limited to a smaller, more manageable set of points. To define a reasonable local search domain, FPVs in the source drawing may be sorted or ordered as explained above, from the rarest type to the most common type, and the rarest type of FPVs may be processed first during the matching stage until a predetermined number of matching FPV pairs are found.

Upon ordering the FPVs in the source drawing, the FPV alignment module 130 may start matching the FPVs in the source drawing (i.e., source FPVs) to the FPVs in the target drawing (i.e., target FPVs). As explained above, the target FPVs may be stored in a 3D hashing table to accelerate the matching process. Briefly, a 3D hashing table may comprise a 3D space defined by x, y, z axes, and further divided along the z axis into a plurality of levels, each level being allocated to FPVs associated with a corresponding FPV type. Thus, each of the target FPVs may be assigned to an appropriate level, and may be positioned along the x-y plane in accordance with the coordinates of the intersection point. The x-y plane at each level may be divided into a plurality of cells. A cell may correspond to a two-dimensional (2D) spatial area representing a division of the target drawing within a given span of the x-y plane. Cells may be used to match FPVs without having to test every target FPVs, further simplifying and accelerating the matching process. Once a predetermined number of matching FPV pairs are identified, the FPV alignment module 130 may generate a transformation matrix based on the matching FPV pairs.

Figure 4:
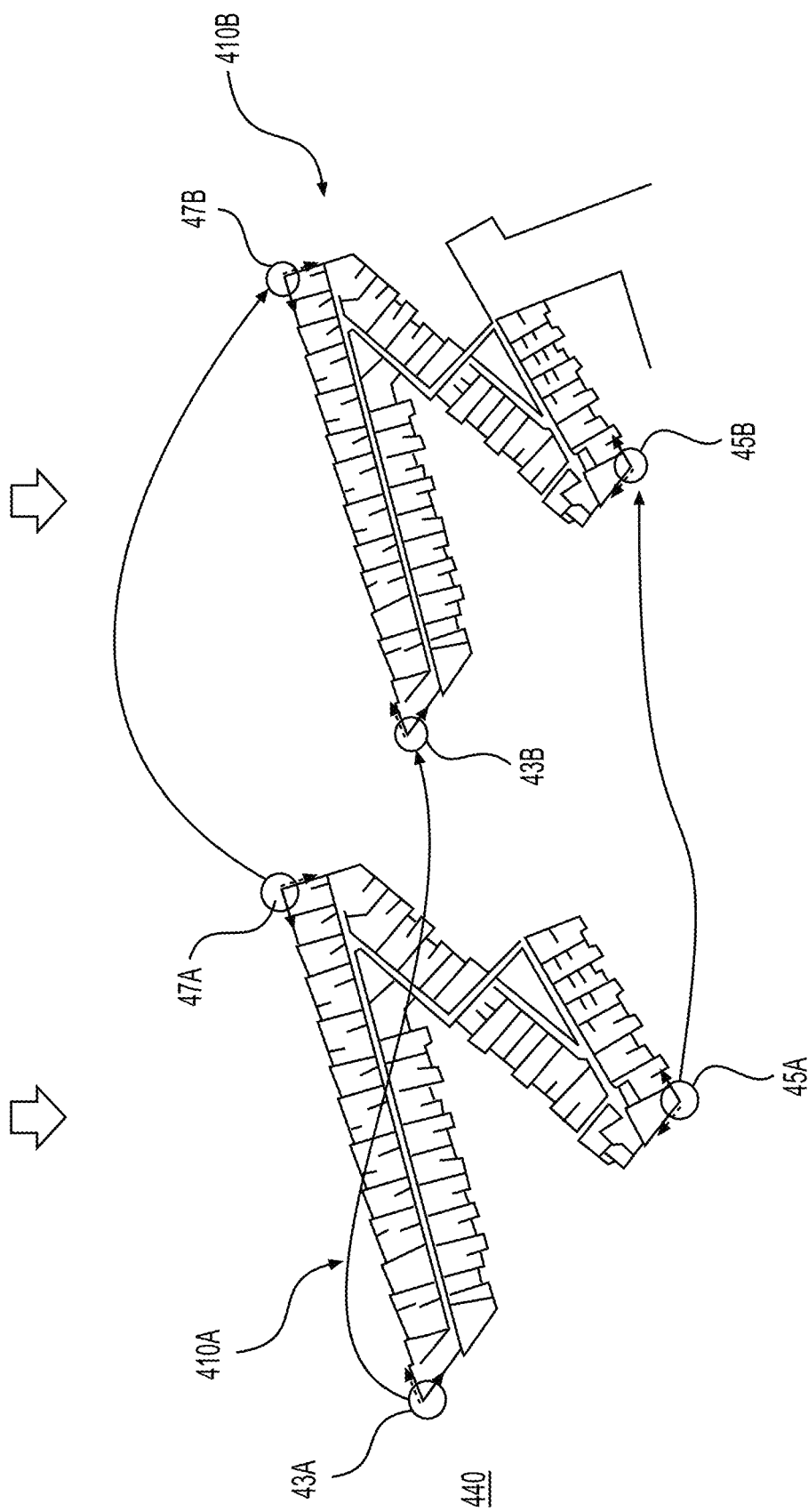
FIG. 4 illustrates a source drawing and a target drawing being processed and transformed through multiple stages of automatic drawing alignment, according to one aspect of the present disclosure.

FIG. 4 illustrates a source drawing and a target drawing being processed and transformed through multiple stages of automatic drawing alignment, according to one aspect of the present disclosure. The stages illustrated in FIG. 4 may be executed by the line extraction module 110, the main axis alignment module 120, and the FPV alignment module 130 illustrated in FIG. 1. At stage 410, the line extraction module 110 may extract various lines forming the source drawing 410A and the target drawing 410B from the respective design documents (e.g., PDF files). At stage 420, the main axis alignment module 120 may determine the main axis 40A of the source drawing 410A and the main axis 40B of the target drawing 410B, using an angle barcode technique. At stage 430, the main axis alignment module 120 may rotate the source drawing 410A until the main axis 40A of the source drawing 410A come into alignment with the main axis 40B of the target drawing 410B. At stage 440, the FPV alignment module 130 may determine a predetermined number of matching FPV pairs, and may generate a transformation matrix based on the matching FPV pairs. In the example shown in FIG. 4, three matching FPV pairs are identified (e.g., 43A-43B, 45A-45B, and 47A-47B). The transformation matrix may be used to map the source drawing 410A to the target drawing 4106 or, in other words, to align the source drawing 410A with the target drawing 410B.

Figure 5:
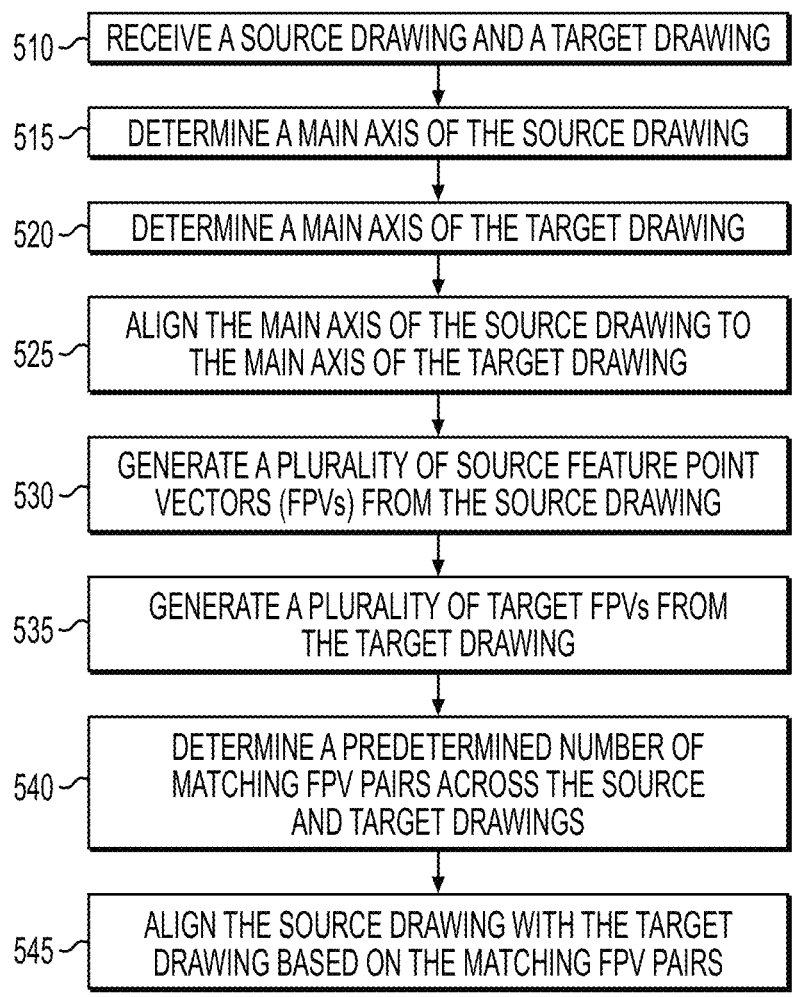
FIG. 5 is a flowchart illustrating an exemplary method of automatically aligning drawings, according to one aspect of the present disclosure.

FIG. 5 is a flowchart illustrating an exemplary method of automatically aligning drawings, according to one aspect of the present disclosure. The method 500 may be performed by the drawing-to-drawing alignment component 105 (i.e., by the individual modules of the drawing-to-drawing alignment component 105). At step 510, the drawing-to-drawing alignment component 105 may receive a source drawing and a target drawing. As explained above, the document review component 155 of the document review application 100 may enable a user to select one or more design documents from which the source drawing and the target drawing may be extracted. In one embodiment, as part of the "receiving" step 510, the line extraction module 110 may extract line segments constituting a source or target drawing from a design document, using a finite state transducer explained above in reference to FIGS. 1 and 3. The line extraction module 110 may further remove line segments that are likely noise and filter line segments based on the size of the cluster containing them, as also explained above.

At step 515, the main axis alignment module 120 may determine a main axis of the source drawing using an angle barcode technique. At step 520, the main axis alignment module 120 may determine a main axis of the target drawing using the angle barcode technique. The angle barcode technique, including generation of the angle-count barcode and the angle-length barcode, will be explained in greater detail in reference to FIGS. 6-7. At step 525, the main axis alignment module 120 may align the main axis of the source drawing to the main axis of the target drawing, by rotating the source drawing until the main axis of the source drawing comes into alignment with the main axis of the target drawing.

At step 530, the FPV alignment module 130 may generate (i.e., extract) a plurality of source FPVs from the source drawing, by transforming each intersection point and intersecting lines into an FPV. The method for transforming an intersection point and intersecting lines into an FPV will be described in greater detail below in reference to FIGS. 8-9. At step 535, the FPV alignment module 130 may also generate a plurality of target FPVs from the target drawing, using the same or similar process explained at step 530. At step 540, the FPV alignment module 130 may determine a predetermined number of matching FPV pairs across the source and target drawings. For computational efficiency and overall performance improvement during the matching process, the source FPVs may be ordered from the rarest type to the most common type and the target FPVs may be classified and stored in a 3D hashing table prior to matching. The matching process, as well as the FPV ordering and 3D hashing table, will be described in greater detail below in reference to FIGS. 10-11 and 13-14. At step 545, the FPV alignment module 130 may align the source drawing with the target drawing based on the matching FPV pairs. The alignment at step 545 may be performed utilizing a transformation matrix, which may be generated based on the matching FPV pairs found across the source and target drawings. The transformation matrix will be discussed in greater detail in reference to FIG. 13.

Figure 6:
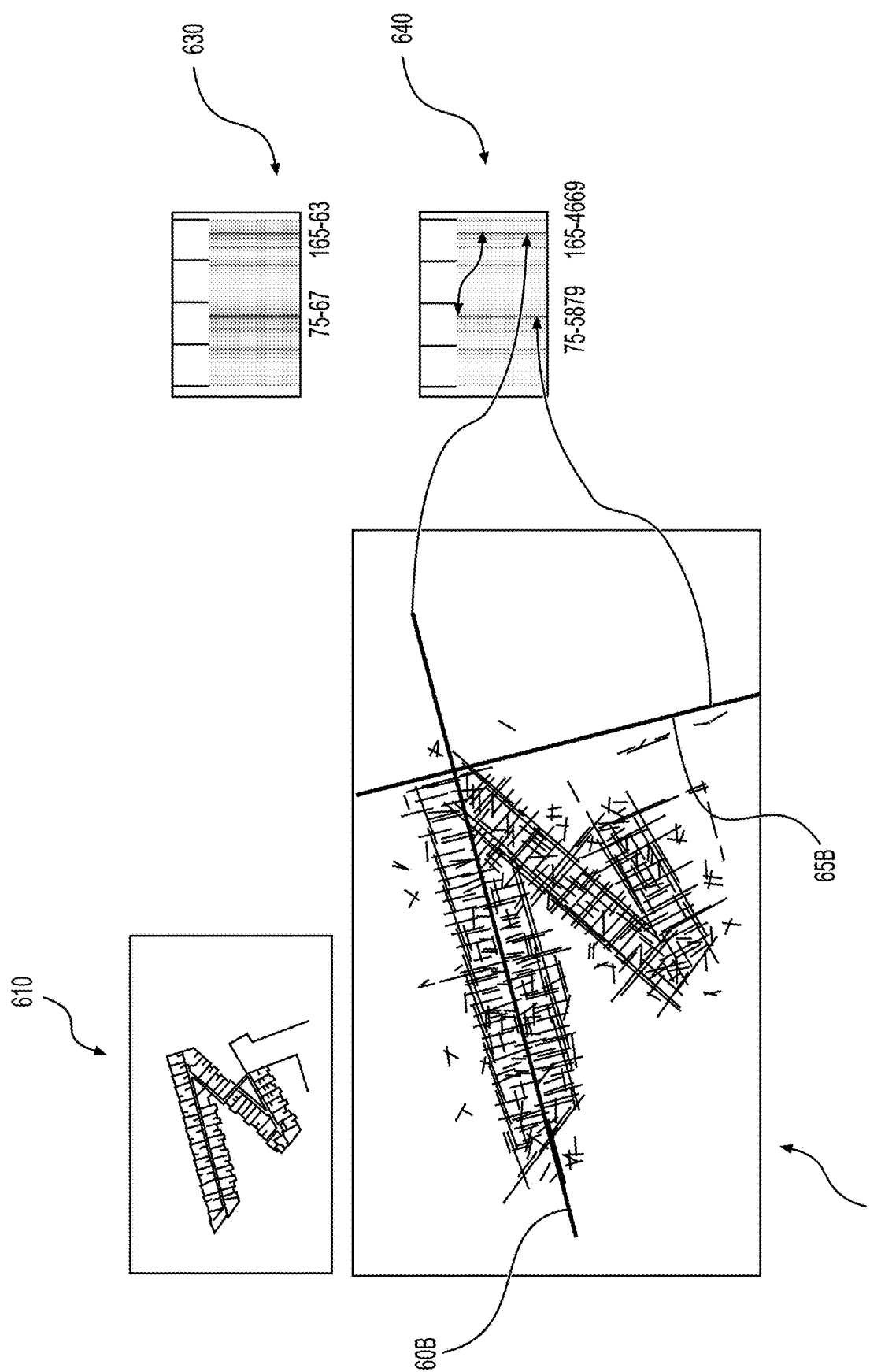
FIG. 6 illustrates an exemplary angle-count barcode and an exemplary angle-length barcode generated from a drawing, according to one aspect of the present disclosure.

FIG. 6 depicts an exemplary angle-count barcode and an exemplary angle-length barcode generated from a drawing, according to one aspect of the present disclosure. The drawing 615 may be a representation of the drawing 610, after extracting, removing, and filtering line segments of the drawing 610 using the processes described above in relation to the line extraction module 110. The drawing 615 may thus be referred to as a pre-processed drawing 615. To generate an angle-count barcode, the main axis alignment module 120 may count the number of line segments associated with each angle from 0 to 180 degrees. An angle associated with each line segment may be the angle between the line segment and a horizontal line in the clockwise direction. For example, line segments that are parallel to the axis 60B may be associated with an angle measuring at 165 degrees. As another example, line segments that are parallel to the axis 65B may be associated with an angle measuring at 75 degrees. Based on the count of line segments determined for each angle, the angle-count barcode 630 may be generated. In the example of FIG. 6, the highest line segment count is associated with a 75-degree angle, and the second highest line segment count is associated with a 165-degree angle.

To generate an angle-length barcode, the main axis alignment module 120 may take the sum of lengths of line segments associated with each angle from 0 to 180 degrees. Again, an angle associated with each line segment may be the angle between the line segment and a horizontal line in the clockwise direction. Based on the total length of line segments associated with each angle, the angle-length barcode 640 may be generated. In the example of FIG. 6, the highest total line length is associated with a 75-degree angle, and the second highest total line length is associated with a 165-degree angle. Based on the angle-count barcode 630, the angle-length barcode 640, or both, the main axis alignment module 120 may determine the axis 65B, which is associated with an angle with the highest line segment count and the highest total line length, to be the main axis of the drawing 610.

Figure 7:
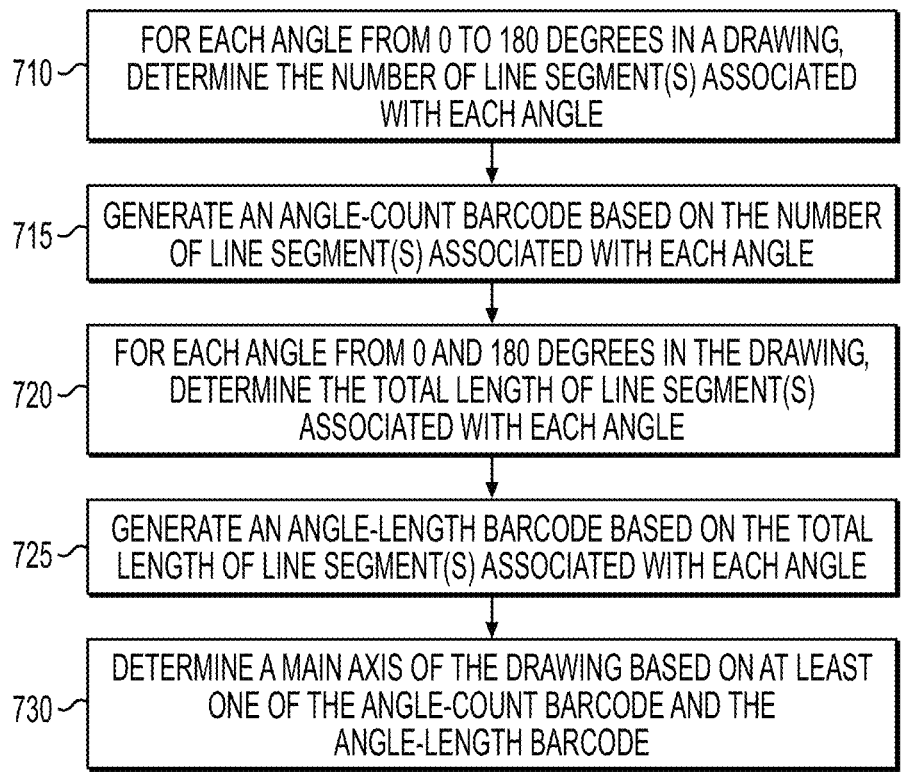
FIG. 7 is a flowchart illustrating an exemplary method of determining a main axis of a drawing, according to one aspect of the present disclosure.

FIG. 7 is a flowchart illustrating an exemplary method of determining a main axis of a drawing, according to one aspect of the present disclosure. The method 700 may be performed by the main axis alignment module 120. At step 710, for each angle from 0 to 180 degrees in a drawing, the main axis alignment module 120 may determine the number of line segment(s) (i.e., line segment count) associated with each angle. The manner in which the line segment count may be determined was explained above in reference to FIG. 6. At step 715, the main axis alignment module 120 may generate an angle-count barcode based on the number of line segment(s) associated with each angle. At step 720, the main axis alignment module 120 may determine the total length of line segment(s) (i.e., total line length) associated with each angle. The manner in which the total line length may be determined was explained above in reference to FIG. 6. At step 725, the main axis alignment module 120 may generate an angle-length barcode based on the total length of line segment(s) associated with each angle.

At step 730, the main axis alignment module 120 may determine a main axis of the drawing based on at least one of the angle-count barcode and the angle-length barcode. In one embodiment, the main axis alignment module 120 may identify an angle that has the highest line segment count, and determine a main axis based on that angle. In another embodiment, the main axis alignment module 120 may identify an angle that has the highest total line length, and determine a main axis based on that angle. In yet another embodiment, the main axis alignment module 120 may identify an angle that has the highest line segment count and the highest total line length, and determine a main axis based on that angle. In yet another embodiment, if an angle associated with the highest line segment count is different from an angle associated with the highest total line length, the main axis alignment module 120 may choose an angle from these two angles by using weighting coefficients or any suitable weighting function.

Figure 8:
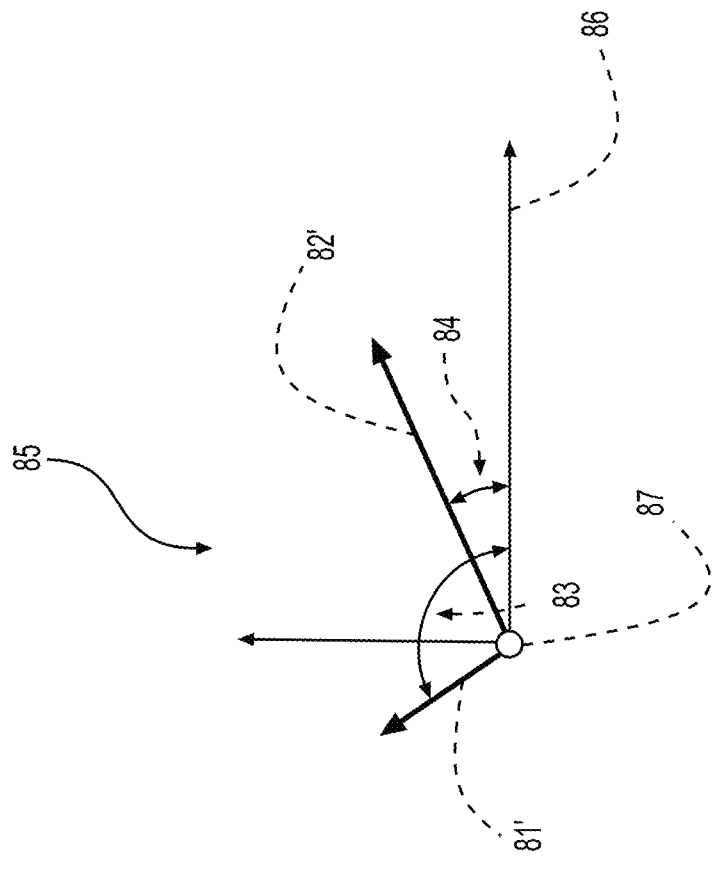
FIG. 8 illustrates an exemplary intersection point in a drawing, and a feature point vector generated based on the intersection point, according to one aspect of the present disclosure.
Figure 8:
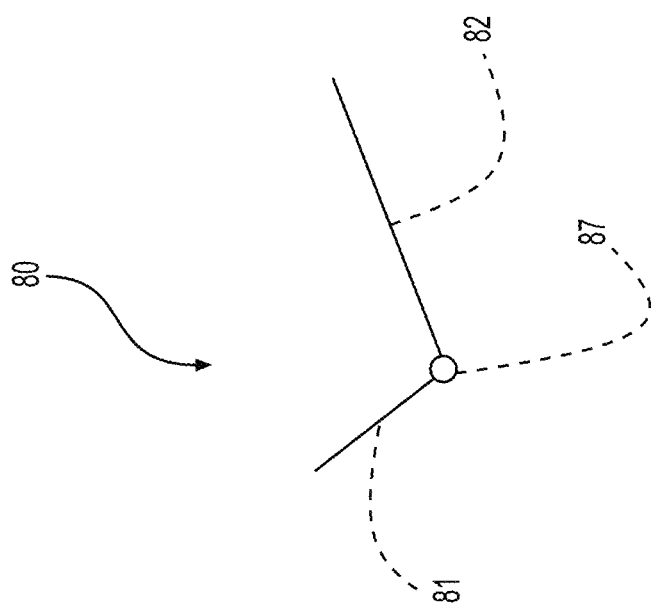

FIG. 8 illustrates an exemplary intersection point in a drawing, and a feature point vector generated based on the intersection point, according to one aspect of the present disclosure. A corner 80 in a drawing may be defined by an intersection point 87 and lines that intersect each other at the intersection point 87 (i.e., intersecting lines 81 and 82). An FPV 85 generated from the intersection point 87 and the intersecting lines 81 and 82 may comprise an intersection point 87 and vectors 81' and 82' that correspond to the intersecting lines 81 and 82 (i.e., a feature vector). In other words, the FPV 85 may comprise an intersection point 87 and a feature vector comprising the vectors 81' and 82'. A vector representation for the feature vector may be generated based on the coordinates of the intersection point 87 and the end points of the intersecting lines 81 and 82 in a 2D plane (i.e., x-y plane). The angles of the vectors 81' and 82' in a counter clockwise direction relative to a horizontal line 86 (i.e., identity angles 83 and 84) may be used as a scale-invariant value to identify the FPV 85. Two FPVs may be considered identical if the identity angles of the FPVs are the same, regardless of the locations of the intersection points.

Figure 9:
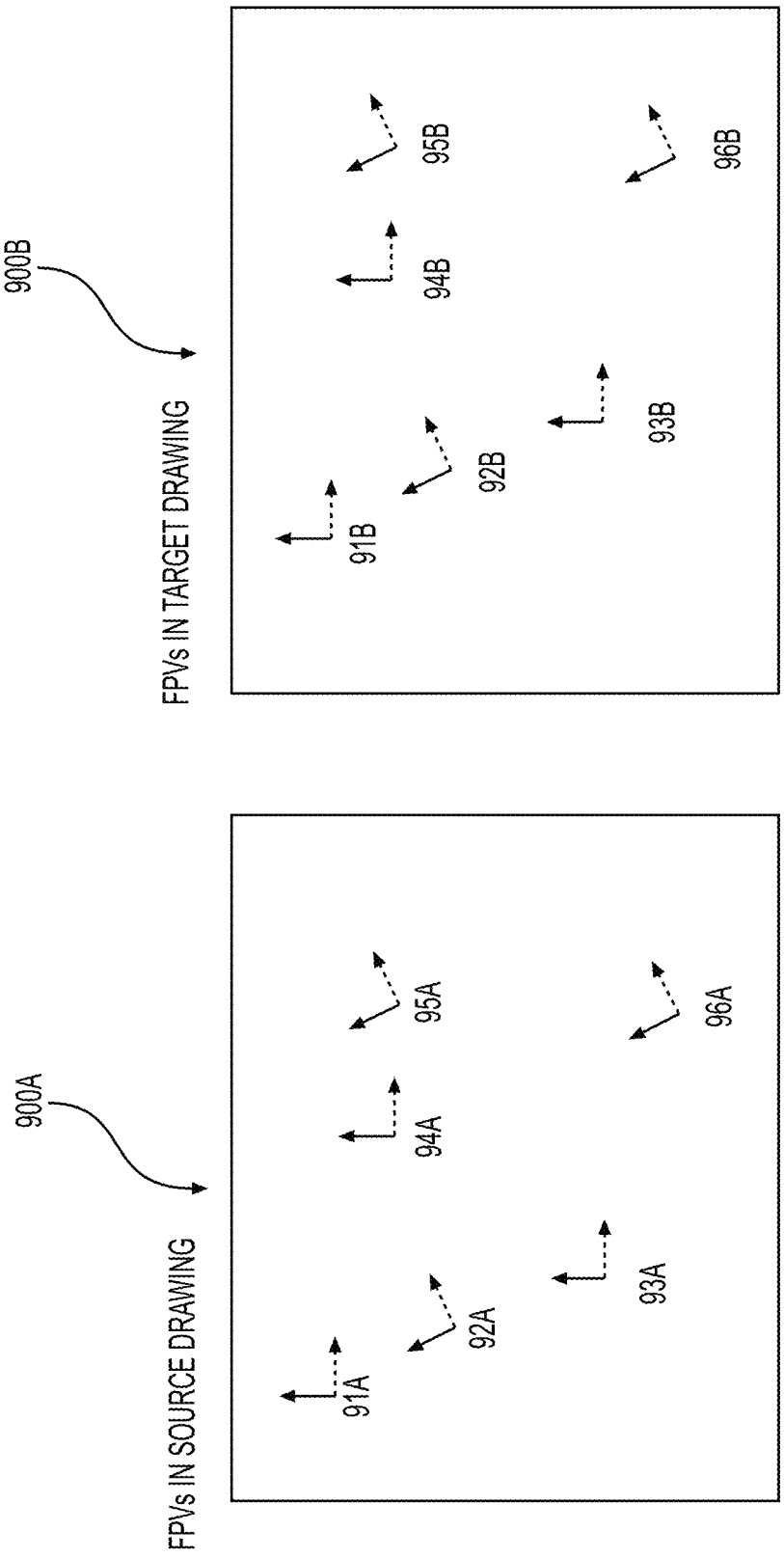
FIG. 9 illustrates exemplary sets of FPVs extracted from a source drawing and a target drawing, according to one aspect of the present disclosure.

FIG. 9 illustrates exemplary sets of FPVs extracted from a source drawing and a target drawing, according to one aspect of the present disclosure. These exemplary sets will be used in subsequent FIGS. 10-11 to describe a 3D hashing table and an FPV matching process performed by the FPV alignment module 130. Particularly, a source set 900A comprises source FPVs 91A-96A extracted from a source drawing, and a target set 900B comprises target FPVs 91B-96B extracted from a target drawing.

Figure 10:
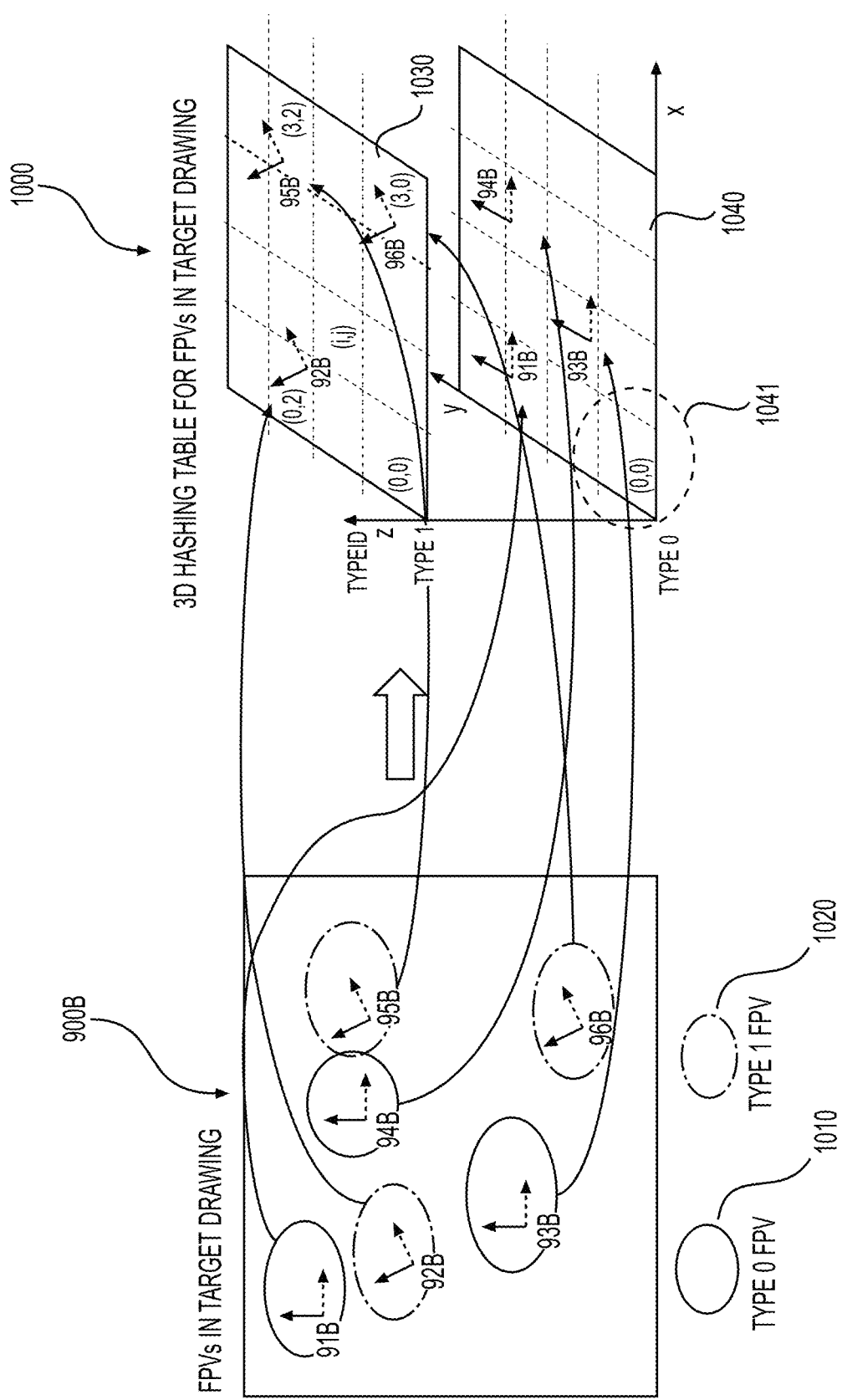
FIG. 10 illustrates an exemplary method of storing FPVs extracted from a target drawing into a 3D hashing table, according to one aspect of the present disclosure.

FIG. 10 illustrates an exemplary method of storing FPVs extracted from a target drawing into a 3D hashing table, according to one aspect of the present disclosure. As explained above, a 3D hashing table, such as the 3D hashing table 1000, may be arranged in a 3D structure comprising x, y, and z dimensions. Multiple levels may be formed along the z-axis, each level being allocated to target FPVs associated with a corresponding FPV type. Therefore, the FPV alignment module 130 may organize the target FPVs into groups based on their FPV types, and place each group of target FPVs associated with an FPV type to an appropriate level in the 3D hashing table. As explained above, an FPV type for an FPV may be determined or characterized by the identity angles of the FPV.

In the example of FIG. 10, target FPVs associated with a first FPV type, e.g., type 0 1010, may be placed in the x-y plane 1040 of the level corresponding to the first FPV type. Target FPVs associated with type 0 1010 may include target FPVs 91B, 93B, and 94B. The target FPVs 91B, 93B, 94B may then be positioned along the x-y plane 1040 based on the x and y coordinates of their respective intersection points.

Similarly, target FPVs associated with a second FPV type, e.g., type 1 1020, may be placed in the x-y plane 1030 of the level corresponding to the second FPV type. Target FPVs associated with type 1 1020 may include target FPVs 92B, 95B, and 96B. The target FPVs 92B, 95B, 96B may then be positioned along the x-y plane 1030 based on the x and y coordinates of their respective intersection points.

In one embodiment, each x-y plane in a 3D hashing table may be divided into multiple cells of equal size (e.g., cell 1041), forming a layer of cells. A cell may be represented by cell coordinates (e.g., (i, j)) indicative of its position on the x-y plane. For example, the cell 1041 may be represented by cell coordinates (0, 0). The cells may simplify and/or expedite the FPV matching process by enabling faster and more efficient identification of matching FPVs. Utilization of cells in the FPV matching process will be described in greater detail in reference to FIG. 11.

Figure 11:
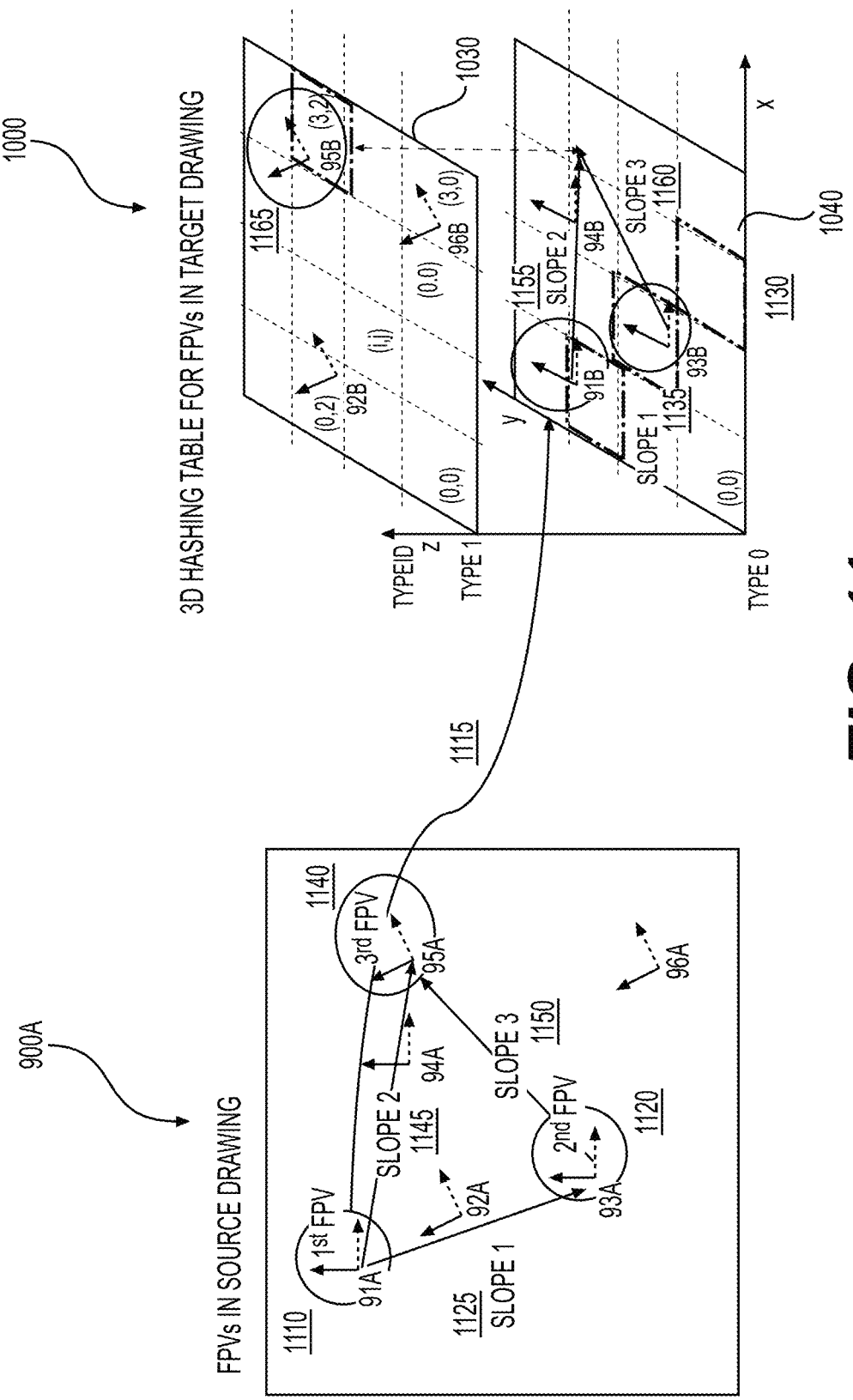
FIG. 11 illustrates an exemplary feature point vector matching process, according to one aspect of the present disclosure.

FIG. 11 illustrates an exemplary feature point vector matching process, according to one aspect of the present disclosure. Particularly, the FPV alignment module 130 may match source FPVs of a source drawing to target FPVs of a target drawing, the target FPVs being stored in a 3D hashing table. As explained above, the matching process may commence with the rarest type of source FPVs, until a predetermined number of matching FPV pairs are identified across the source and target drawings. The degree of rarity associated with a source FPV may be determined based on the number of source FPVs associated with its FPV type (i.e., the number of source FPVs having the same identity angles as the source FPV). In other words, the fewer source FPVs there are having the same identity angles as a source FPV, the rarer the source FPV may be. Prior to the matching process, the source FPVs may be ordered from the rarest type to the most common type. Then, the matching process may be performed in accordance with the order, starting from the rarest type of FPVs and continuing to more common types of FPVs, as needed. For instance, the matching process may terminate when a predetermined number (e.g., three in the example of FIG. 11) of matching FPV pairs are found. The number of matching FPV pairs to identify may be predetermined and configured by an administrator/operator or may be automatically configured by the FPV alignment module 130 based on various parameters associated with the source and/or target drawings.

It should be noted that, although it may be preferred to process the rarest type of FPVs first during matching, the techniques described herein are not limited to such arrangement. For instance, the FPVs that are not of the rarest type may be processed first during matching, or the FPVs from the source drawing may be randomly selected for matching regardless of how rare or common they are. Further, even under a configuration in which FPVs are processed/matched starting from the rarest to the most common type, it may not be required to process all FPVs associated with a certain type before moving on to FPVs associated with a more common type. In view of the foregoing, it should be clear that the order in which the FPVs are processed/matched may be configured in various ways, depending on developer preferences, user preferences, system capacity or requirements, etc.

With continuing reference to FIG. 11, at stage 1110, from the ordered source FPVs, the FPV alignment module 130 may identify a first source FPV, e.g., a source FPV 91A, to match to a target FPV. In one embodiment, if there are multiple source FPVs that are associated with the rarest FPV type, the first source FPV may be randomly selected among the rarest source FPVs. At stage 1115, based on the FPV type of the first source FPV 91A, the FPV alignment module 130 may identify a level in the 3D hashing table 1000 that corresponds to the FPV type (i.e., the level comprising the x-y plane 1140), and may locate a target FPV 91B that matches with the first source FPV 91A. The first source FPV 91A and the matching target FPV 91B may together form a first matching FPV pair. The use of the 3D hashing table may lead to substantial computational efficiency and increased processing speed, as the FPV alignment module 130 need only search the level that corresponds to the FPV type of a source FPV, without having to search in levels associated with other FPV types.

At stage 1120, the FPV alignment module 130 may identify a second source FPV, e.g., a source FPV 93A, to match to another target FPV. In the example of FIG. 11, the second source FPV 93A is illustrated as having the same FPV type as the first source FPV 91A. However, it should be noted that a second source FPV may instead be associated with an FPV type that is different from that of a first source FPV. As explained above, the order by which the source FPVs are matched may be configured in various ways.

With continuing reference to FIG. 11, the second source FPV 93A, which is of the same FPV type as the first source FPV 91A, may be randomly selected among the rest of the rarest source FPVs. Once the second source FPV 93A has been identified, at stage 1125, the FPV alignment module 130 may calculate a slope between the first source FPV 91A and the second source FPV 93A.

Using the slope calculated at stage 1125, at stage 1130, the FPV alignment module 130 may find candidate cells in the x-y plane 1040 in which a target FPV matching the second source FPV 93A may be found. More particularly, the FPV alignment module 130 may determine cells that are positioned substantially along the path of the slope extending from the cell in which the target FPV 91B matching the first source FPV 91A was found. By utilizing the slope, the FPV alignment module 130 may only need to search in cells that lie long the path of the slope, resulting in further computational efficiency and increased processing speed. At stage 1135, the FPV alignment module 130 may locate a target FPV 93B that matches with the second source FPV 93A, in one of the candidate cells determined at stage 1130. The second source FPV 93A and the matching target FPV 93B may together form a second matching FPV pair.

At stage 1140, the FPV alignment module 130 may identify a third source FPV, e.g., a source FPV 95A, to match to another target FPV. In the example of FIG. 11, the third source FPV 95A is illustrated as having a different FPV type as the second source FPV 93A. However, it should be noted that a third source FPV may instead be associated with an FPV type that is the same as that of a second source FPV.

With continuing reference to FIG. 11, the third source FPV 95A may be randomly selected among the source FPVs having the same FPV type. Once the third source FPV 95A has been identified, at stages 1145 and 1150, the FPV alignment module 130 may calculate a slope between the first source FPV 91A and the third source FPV 95A (i.e., slope 2) and a slope between the second source FPV 93A and the third source FPV 95A (i.e., slope 3).

Using the slopes calculated at stages 1145 and 1150, at stages 1155 and 1160, the FPV alignment module 130 may find a candidate cell in which a target FPV matching the third source FPV 95A may be found. More particularly, the candidate cell can be located by finding a point at which a line with slope 2 extending from the target FPV 91B and a line with slope 3 extending from the target FPV 93B intersect, at the level or the x-y plane that corresponds to the FPV type of the third source FPV 95A (i.e., x-y plane 1030). A cell that encloses this intersection point at the x-y plane 1030 may be determined to be the candidate cell. At stage 1165, the FPV alignment module 130 may locate a target FPV 95B that matches with the third source FPV 95A in the candidate cell determined through stages 1155 and 1160. The third source FPV 95A and the matching target FPV 95B may together form a third matching FPV pair. Because a predetermined number of matching FPV pairs (i.e., three) have been found, the FPV alignment module 130 may terminate the matching process and use the matching FPV pairs to generate a transformation matrix.

Figure 12:
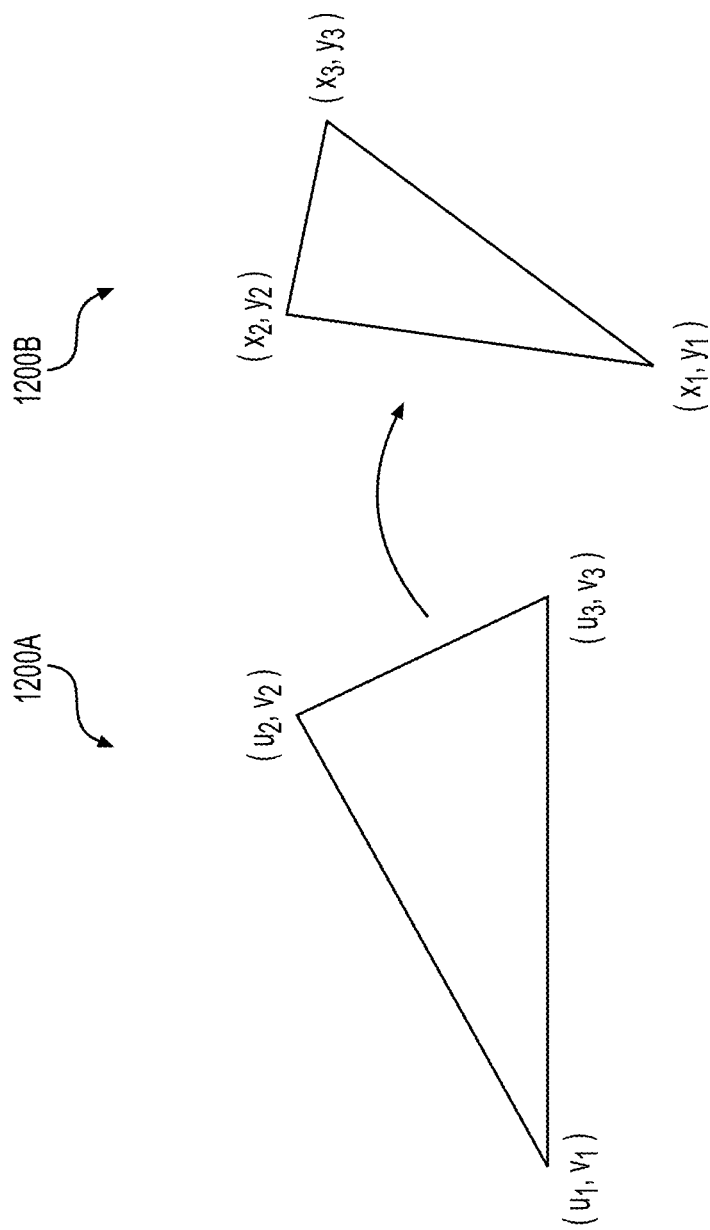
FIG. 12 illustrates an exemplary method of generating a transformation matrix based on matching feature point vector (FPV) pairs, according to one aspect of the present disclosure.

FIG. 12 illustrates an exemplary method of generating a transformation matrix based on matching feature point vector (FPV) pairs, according to one aspect of the present disclosure. As explained above, the matching FPV pairs found across the source and target drawings may be used by the FPV alignment module 130 to calculate a transformation matrix, which maps the source drawing to the target drawing for alignment. In one embodiment, the coordinates for the intersection points associated with the source FPVs (e.g., $(u_i, v_i)$) and the coordinates for the intersection points associated with the matching target FPVs (e.g., $(x_i, y_i)$) may be used to compute an affine transformation. Hypothetically, a triangle 1200A may be formed based on the source FPVs (i.e., the angles and intersection point coordinates of the respective source FPVs) and a triangle 1200B may be formed based on the target FPVs (i.e., the angels and intersection point coordinates of the respective target FPVs), as illustrated in FIG. 12. The triangles 1200A and 1200B may comprise the same angles but may be of different scales and/or orientations.

More particularly, in the case of three matching FPV pairs (i.e., a predetermined number of matching FPV pairs is set at three), given matching pairs of points $(u_i, v_i) \rightarrow (x_i, y_i)$, the affine transformation may be computed by solving the following equation for $a_{ij}$:

$$\begin{bmatrix} u_1 & u_2 & u_3 \\ v_1 & v_2 & v_3 \\ 1 & 1 & 1 \end{bmatrix} = \begin{bmatrix} a_{11} & a_{12} & a_{13} \\ a_{21} & a_{22} & a_{23} \\ 0 & 0 & 1 \end{bmatrix} \begin{bmatrix} x_1 & x_2 & x_3 \\ y_1 & y_2 & y_3 \\ 1 & 1 & 1 \end{bmatrix}$$

Figure 13:
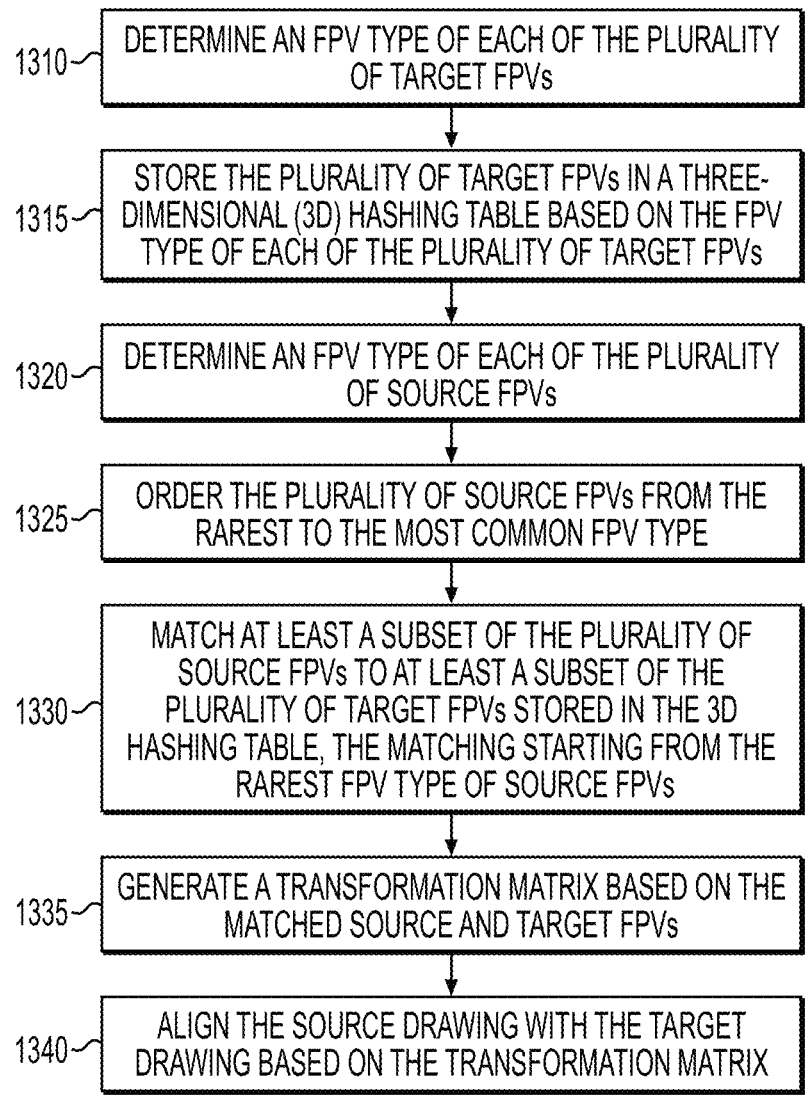
FIG. 13 is a flowchart illustrating an exemplary method of aligning a source drawing with a target drawing based on matching FPV pairs found across the source drawing and the target drawing, according to one aspect of the present disclosure.

FIG. 13 is a flowchart illustrating an exemplary method of aligning a source drawing with a target drawing based on matching FPV pairs found across the source drawing and the target drawing, according to one aspect of the present disclosure. Notably, FIG. 13 is a more detailed illustration of steps 540 and 545 of FIG. 5, and encompasses the techniques discussed above in reference to FIGS. 9-12. The method 1300 may be performed by the FPV alignment module 130.

At step 1310, the FPV alignment module 130 may determine an FPV type of each of the plurality of target FPVs (i.e., the plurality of target FPVs generated at step 535). As discussed above, an FPV type or an identity value for an FPV may be defined by identity angles associated with the FPV. At step 1315, the FPV alignment module 1315 may store the plurality of target FPVs in a 3D hashing table based on the FPV type of each of the plurality of target FPVs. The manner in which the target FPVs may be stored in a 3D hashing table was described above in reference to FIG. 10. At step 1320, the FPV alignment module 130 may determine an FPV type of each of the plurality of source FPVs (i.e., the plurality of source FPVs generated at step 530). At step 1325, the FPV alignment module 130 may order the plural-ity of source FPVs from the rarest FPV type (i.e., the FPV type with which the least number of source FPVs are associated) to the most common FPV type (i.e., the FPV type with which the most number of source FPVs are associated).

At step 1330, the FPV alignment module 1330 may match at least a subset of the plurality of source FPVs to at least a subset of the plurality of target FPVs stored in the 3D hashing table, the matching starting from the rarest FPV type of source FPVs. The matching process was described in detail above in reference to FIG. 11. It should be noted again that the ordering of the source FPVs by their types (i.e., step 1325) and the subsequent matching in accordance with the order (i.e., step 1330) are merely preferred methods, in order to speed up the matching process and save computational resources. Such ordering is optional and the matching step is not limited to being performed in a particular order. In other words, the source FPVs may be randomly selected or ordered differently for matching with the target FPVs. Further, a subset of the plurality of source FPVs may mean a predetermined number of source FPVs, the predetermined number being configured by a user or automatically by the system as explained above.

At step 1335, the FPV alignment module 1335 may generate a transformation matrix based on the matched source and target FPVs (i.e., the matching FPV pairs). Transformation matrix generation was described in detail above in reference to FIG. 12. At step 1340, the FPV alignment module 1340 may align the source drawing with the target drawing (or map the source drawing to the target drawing) based on the transformation matrix.

Figure 14:
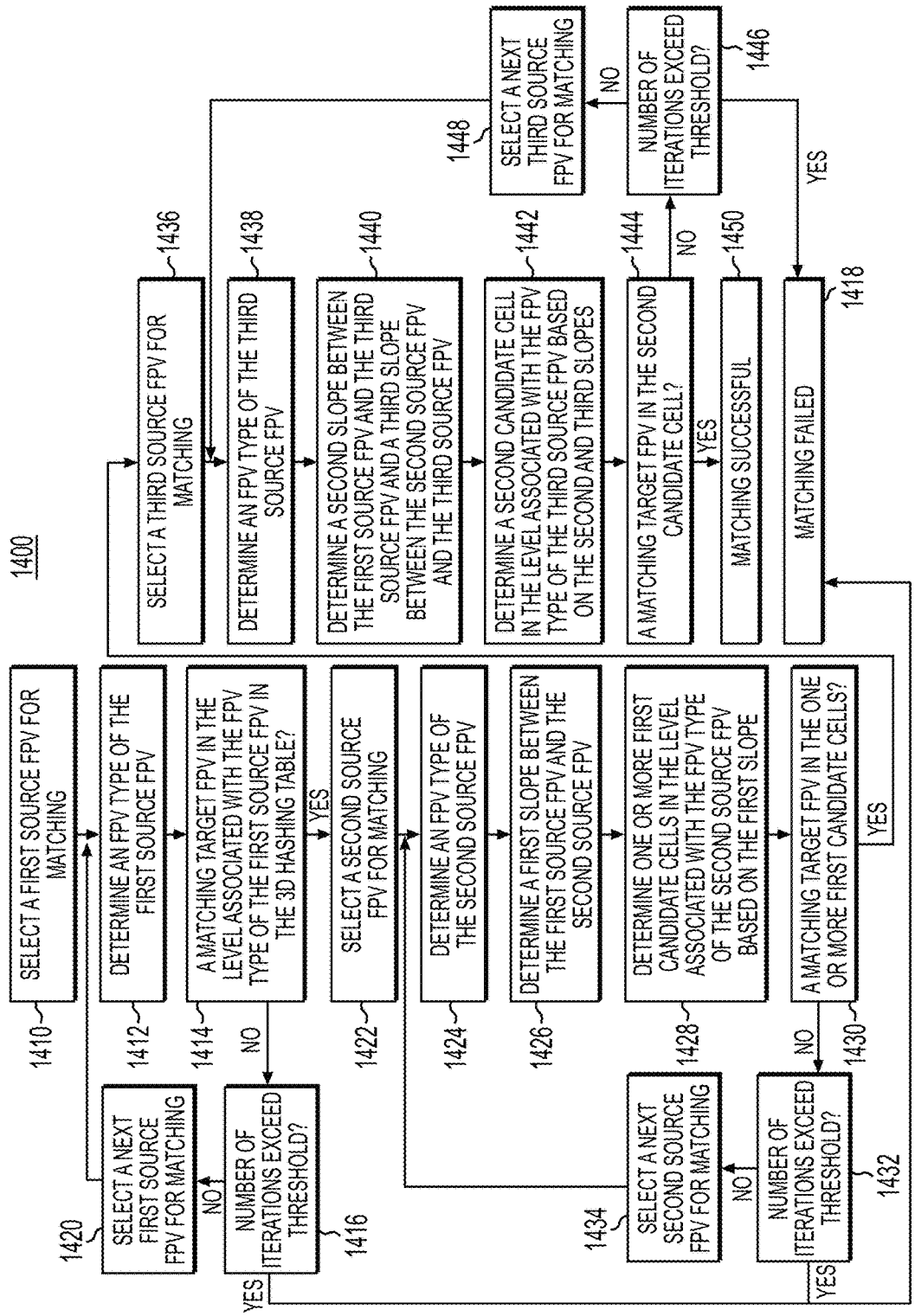
FIG. 14 is a flowchart illustrating an exemplary method of matching source FPVs to target FPVs, according to one aspect of the present disclosure.

FIG. 14 is a flowchart illustrating an exemplary method of matching source FPVs to target FPVs, according to one aspect of the present disclosure. Notably, FIG. 14 is a more detailed illustration of step 1330 of FIG. 13, and encompasses the techniques discussed above in reference to FIG. 11. The method 1400 may be performed by the FPV alignment module 130. Furthermore, the predetermined number of source FPVs to be matched with target FPVs is set to be three in the example of FIG. 14.

At step 1410, the FPV alignment module 130 may select a first source FPV for matching. The manner in which source FPVs may be selected for matching was described above in reference to FIGS. 11 and 13. At step 1412, the FPV alignment module 130 may determine an FPV type of the first source FPV. At step 1414, the FPV alignment module 130 may determine whether a target FPV matching the first source FPV exists in the level associated with the FPV type of the first source FPV in the 3D hashing table. If a target FPV matching the first source does not exist, the method 1400 may proceed to step 1416, where a number of iterations for finding a target FPV matching the first source FPV is calculated (e.g., via a counter). If the number of iterations exceeds a predetermined threshold, the method 1400 may proceed to step 1418, where the FPV alignment module 130 may determine that the matching has failed. If the number of iterations does not exceed a predetermined threshold, the method 1400 may proceed to step 1420, where the FPV alignment module 130 may select a next first source FPV for matching and repeat the matching process for the next-selected first source FPV via the steps 1412 and 1414.

At step 1414, if the FPV alignment module 130 determines that a target FPV matching the first source FPV exists in the level associated with the FPV type of the first source FPV, the FPV alignment module 130 may then select a second source FPV for matching at step 1422. At step 1424, the FPV alignment module 130 may determine an FPV type of the second source FPV. At step 1426, the FPV alignment module 130 may determine a first slope between the first source FPV and the second source FPV. At step 1428, the FPV alignment module 130 may determine one or more first candidate cells in the level associated with the FPV type of the second source FPV, using the first slope. As explained above in reference to FIG. 11, one or more cells along the path of a line with the first slope, extending from the target FPV found to match the first source FPV, may be identified as the first candidate cell(s). At step 1430, the FPV alignment module 130 may determine whether a target FPV matching the second source FPV exists in the one or more first candidate cells. If a target FPV matching the second source does not exist, the method 1400 may proceed to step 1432, where a number of iterations for finding a target FPV matching the second source FPV is calculated (e.g., via a counter). If the number of iterations exceeds a predetermined threshold, the method 1400 may proceed to step 1418, where the FPV alignment module 130 may determine that the matching has failed. If the number of iterations does not exceed a predetermined threshold, the method 1400 may proceed to step 1434, where the FPV alignment module 130 may select a next second source FPV for matching and repeat the matching process for the next-selected second source FPV via the steps 1424 and 1430.

At step 1430, if the FPV alignment module 130 determines that a target FPV matching the second source FPV exists in the one or more first candidate cells, the FPV alignment module 130 may then select a third source FPV for matching at step 1436. At step 1438, the FPV alignment module 130 may determine an FPV type of the third source FPV. At step 1440, the FPV alignment module 130 may determine a second slope between the first source FPV and the third source FPV and a third slope between the second source FPV and the third source FPV. At step 1442, the FPV alignment module 130 may determine a second candidate cell in the level associated with the FPV type of the third source FPV, using the first and second slopes. The manner in which the second candidate cell may be determined was described above in reference to FIG. 11 and will not be repeated here for the sake of brevity. At step 1444, the FPV alignment module 130 may determine whether a target FPV matching the third source FPV exists in the second candidate cell. If a target FPV matching the third source FPV does not exist, the method 1400 may proceed to step 1446, where a number of iterations for finding a target FPV matching the third source FPV may be calculated (e.g., via a counter). If the number of iterations exceeds a predetermined threshold, the method 1400 may proceed to step 1418, where the FPV alignment module 130 may determine that the matching has failed. If the number of iterations does not exceed a predetermined threshold, the method 1400 may proceed to step 1448, where the FPV alignment module 130 may select a next third source FPV for matching and repeat the matching process for the next-selected third source FPV via the steps 1438 and 1444.

At step 1444, if the FPV alignment module 130 determines that a target FPV matching the third source FPV exists in the second candidate cell, the FPV alignment module 130 may determine that the matching is successful at step 1450. As explained above, the matching may be determined successful if a predetermined number of matching FPV pairs are found across the source and target documents. Using a transformation matrix generated based on the matching FPV pairs, the source drawing may be aligned with the target drawing.

Unless specifically stated otherwise, as apparent from the following discussions, it is appreciated that throughout the specification discussions utilizing terms such as "processing," "computing," "calculating," "determining", "analyzing" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer," a "computing machine," a "computing platform," a "computing device," or a "server" may include one or more processors.

Figure 15:
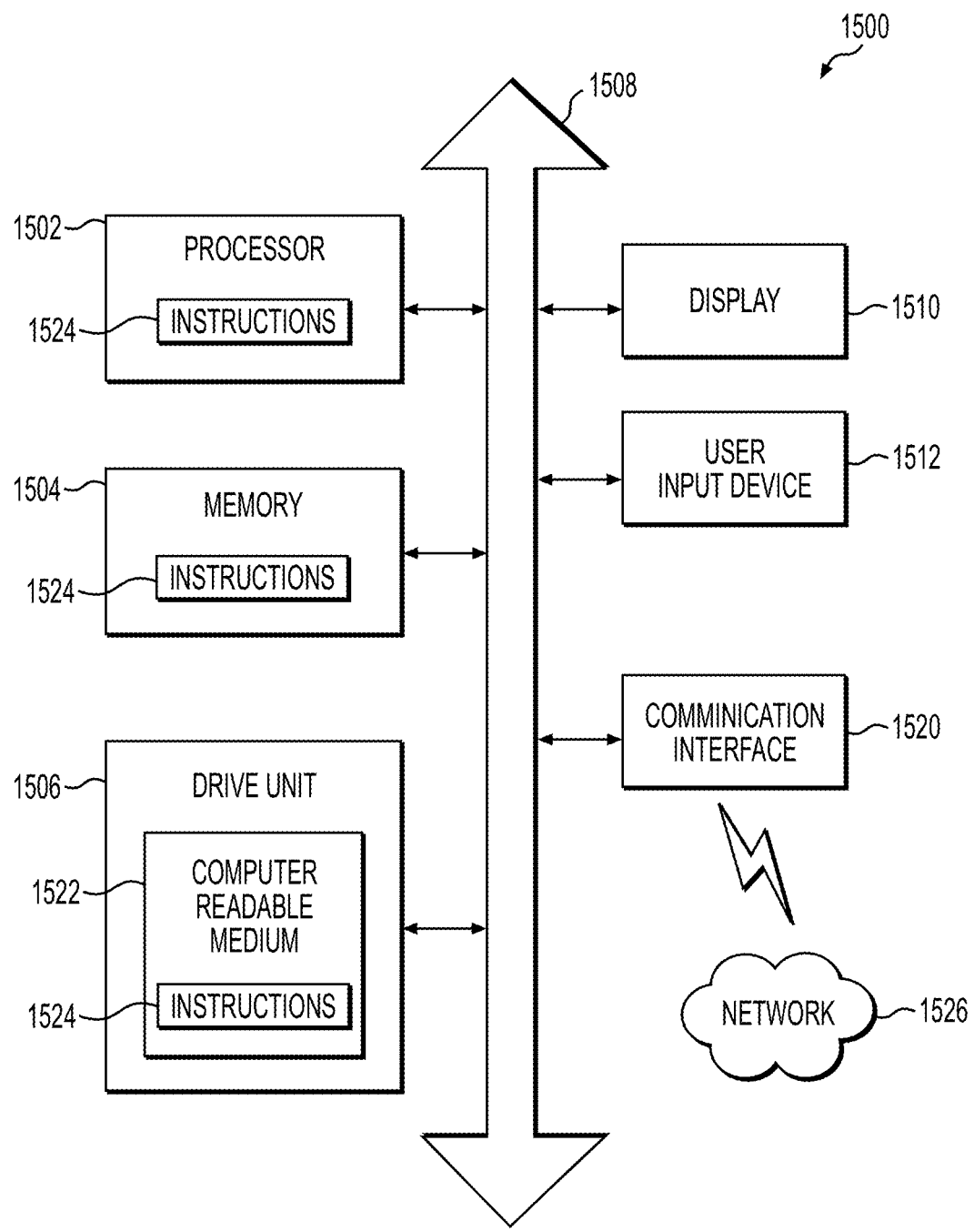
FIG. 15 illustrates an implementation of a computer system that may execute techniques presented herein.

FIG. 15 illustrates an implementation of a computer system designated 1500. The computer system 1500 can include a set of instructions that can be executed to cause the computer system 1500 to perform any one or more of the methods or computer based functions disclosed herein. The computer system 1500 may operate as a standalone device or may be connected, e.g., using a network, to other computer systems or peripheral devices.

In a networked deployment, the computer system 1500 may operate in the capacity of a server or as a client user computer in a server-client user network environment, or as a peer computer system in a peer-to-peer (or distributed) network environment. The computer system 1500 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the computer system 1500 can be implemented using electronic devices that provide voice, video, or data communication. Further, while a single computer system 1500 is illustrated, the term "system" shall also be taken to include any collection of systems or sub-systems that individually or jointly execute a set, or multiple sets, of instructions to perform one or more computer functions.

As illustrated in FIG. 15, the computer system 1500 may include a processor 1502, e.g., a central processing unit (CPU), a graphics processing unit (GPU), or both. The processor 1502 may be a component in a variety of systems. For example, the processor 1502 may be part of a standard personal computer or a workstation. The processor 1502 may be one or more general processors, digital signal processors, application specific integrated circuits, field programmable gate arrays, servers, networks, digital circuits, analog circuits, combinations thereof, or other now known or later developed devices for analyzing and processing data. The processor 1502 may implement a software program, such as code generated manually (i.e., programmed).

The computer system 1500 may include a memory 1504 that can communicate via a bus 1508. The memory 1504 may be a main memory, a static memory, or a dynamic memory. The memory 1504 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 1504 includes a cache or random-access memory for the processor 1502. In alternative implementations, the memory 1504 is separate from the processor 1502, such as a cache memory of a processor, the system memory, or other memory. The memory 1504 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 1504 is operable to store instructions executable by the processor 1502. The functions, acts or tasks illustrated in the figures or described herein may be performed by the programmed processor 1502 executing the instructions stored in the memory 1504. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the computer system 1500 may further include a display 1510, such as a liquid crystal display (LCD), an organic light emitting diode (OLED), a flat panel display, a solid-state display, a cathode ray tube (CRT), a projector, a printer or other now known or later developed display device for outputting determined information. The display 1510 may act as an interface for the user to see the functioning of the processor 1502, or specifically as an interface with the software stored in the memory 1504 or in the drive unit 1506.

Additionally or alternatively, the computer system 1500 may include an input device 1512 configured to allow a user to interact with any of the components of system 1500. The input device 1512 may be a number pad, a keyboard, or a cursor control device, such as a mouse, or a joystick, touch screen display, remote control, or any other device operative to interact with the computer system 1500.

The computer system 1500 may also or alternatively include a disk or optical drive unit 1506. The disk drive unit 1506 may include a computer-readable medium 1522 in which one or more sets of instructions 1524, e.g. software, can be embedded. Further, the instructions 1524 may embody one or more of the methods or logic as described herein. The instructions 1524 may reside completely or partially within the memory 1504 and/or within the processor 1502 during execution by the computer system 1500. The memory 1504 and the processor 1502 also may include computer-readable media as discussed above.

In some systems, a computer-readable medium 1522 includes instructions 1524 or receives and executes instructions 1524 responsive to a propagated signal so that a device connected to a network 1526 can communicate voice, video, audio, images, or any other data over the network 1526. Further, the instructions 1524 may be transmitted or received over the network 1526 via a communication port or interface 1520, and/or using a bus 1508. The communication port or interface 1520 may be a part of the processor 1502 or may be a separate component. The communication port 1520 may be created in software or may be a physical connection in hardware. The communication port 1520 may be configured to connect with a network 1526, external media, the display 1510, or any other components in computer system 1500, or combinations thereof. The connection with the network 1526 may be a physical connection, such as a wired Ethernet connection or may be established wirelessly as discussed below. Likewise, the additional connections with other components of the computer system 1500 may be physical connections or may be established wirelessly. The network 1526 may alternatively be directly connected to the bus 1508.

While the computer-readable medium 1522 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 1522 may be non-transitory, and may be tangible.

The computer-readable medium 1522 can include a solid-state memory such as a memory card or other package that houses one or more non-volatile read-only memories. The computer-readable medium 1522 can be a random-access memory or other volatile re-writable memory. Additionally or alternatively, the computer-readable medium 1522 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The computer system 1500 may be connected to one or more networks 1526. The network 1526 may define one or more networks including wired or wireless networks. The wireless network may be a cellular telephone network, an 802.11, 802.16, 802.20, or WiMax network. Further, such networks may include a public network, such as the Internet, a private network, such as an intranet, or combinations thereof, and may utilize a variety of networking protocols now available or later developed including, but not limited to TCP/IP based networking protocols. The network 1526 may include wide area networks (WAN), such as the Internet, local area networks (LAN), campus area networks, metropolitan area networks, a direct connection such as through a Universal Serial Bus (USB) port, or any other networks that may allow for data communication. The network 1526 may be configured to couple one computing device to another computing device to enable communication of data between the devices. The network 1526 may generally be enabled to employ any form of machine-readable media for communicating information from one device to another. The network 1526 may include communication methods by which information may travel between computing devices. The network 1526 may be divided into sub-networks. The sub-networks may allow access to all of the other components connected thereto or the sub-networks may restrict access between the components. The network 1526 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component/object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the steps of methods discussed are performed in one embodiment by an appropriate processor (or processors) of a processing (i.e., computer) system executing instructions (computer-readable code) stored in storage. It will also be understood that the disclosed embodiments are not limited to any particular implementation or programming technique and that the disclosed embodiments may be implemented using any appropriate techniques for implementing the functionality described herein. The disclosed embodiments are not limited to any particular programming language or operating system.

It should be appreciated that in the above description of exemplary embodiments, various features of the present disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed embodiment requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment.

Furthermore, while some embodiments described herein include some but not other features included in other embodiments, combinations of features of different embodiments are meant to be within the scope of the present disclosure, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosed techniques.

In the description provided herein, numerous specific details are set forth. However, it is understood that embodiments of the present disclosure may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments, those skilled in the art will recognize that other and further modifications may be made thereto without departing from the spirit of the present disclosure, and it is intended to claim all such changes and modifications as falling within the scope of the present disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The above disclosed subject matter is to be considered illustrative, and not restrictive, and the appended claims are intended to cover all such modifications, enhancements, and other implementations, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description. While various implementations of the disclosure have been described, it will be apparent to those of ordinary skill in the art that many more implementations and implementations are possible within the scope of the disclosure. Accordingly, the disclosure is not to be restricted except in light of the attached claims and their equivalents.

What is claimed is:

1. A computer-implemented method for automatically aligning drawings, comprising:
   receiving a source drawing and a target drawing;
   generating an angle-count barcode based on a number of lines associated with each angle for each of the source drawing and the target drawing;
   determining a main axis of the source drawing and a main axis of the target drawing based at least in part on the angle-count barcode;

aligning the main axis of the source drawing to the main axis of the target drawing;
generating a plurality of source feature point vectors (FPVs) from the source drawing and a plurality of target FPVs from the target drawing;
determining a predetermined number of matching FPV pairs across the source drawing and the target drawing; and
aligning the source drawing with the target drawing based on the matching FPV pairs.

2. The computer-implemented method of claim 1, wherein determining the main axis of the source drawing and the main axis of the target drawing comprises, for each of the source drawing and the target drawing:
generating an angle-length barcode based on a total length of lines associated with each angle; and
determining the main axis based at least in part on the angle-length barcode.

3. The computer-implemented method of claim 1, wherein aligning the main axis of the source drawing to the main axis of the target drawing comprises:
rotating the source drawing until the main axis of the source drawing becomes aligned with the main axis of the target drawing.

4. The computer-implemented method of claim 1, wherein determining the predetermined number of matching FPV pairs across the source drawing and the target drawing comprises:
determining a type of each of the plurality of target FPVs; and
storing the plurality of target FPVs in a three-dimensional (3D) hashing table based on the type of each of the plurality of target FPVs.

5. The computer-implemented method of claim 1, wherein determining the predetermined number of matching FPV pairs across the source drawing and the target drawing comprises:
determining a type of each of the plurality of source FPVs; and
determining a number of source FPVs associated with each type.

6. The computer-implemented method of claim 5, wherein determining the predetermined number of matching FPV pairs across the source drawing and the target drawing further comprises:
determining a least common type of source FPVs based on the determined number of source FPVs associated with each type; and
matching a predetermined number of source FPVs to a predetermined number of target FPVs,
wherein the matching starts from the least common type of source FPVs.

7. The computer-implemented method of claim 5, wherein the type of each of the plurality of source FPVs is defined by one or more angles associated with the respective source FPV.

8. The computer-implemented method of claim 1, wherein aligning the source drawing with the target drawing based on the matching FPV pairs comprises:
determining a transformation matrix based on the matching FPV pairs; and
aligning the source drawing with the target drawing based on the transformation matrix.

9. The computer-implemented method of claim 8, wherein the transformation matrix is determined using an affine transformation.

10. A system for automatically aligning drawings, comprising:
one or more processors;
at least one non-transitory computer readable medium storing instructions which, when executed by the one or more processors, cause the one or more processors to perform operations comprising:
receiving a source drawing and a target drawing;
determining a main axis of the source drawing and a main axis of the target drawing;
aligning the main axis of the source drawing to the main axis of the target drawing;
generating a plurality of source feature point vectors (FPVs) from the source drawing and a plurality of target FPVs from the target drawing;
determining a predetermined number of matching FPV pairs across the source drawing and the target drawing by determining a type of each of the plurality of target FPVs and storing the plurality of target FPVs in a three-dimensional (3D) hashing table based on the type of each of the plurality of target FPVs; and
aligning the source drawing with the target drawing based on the matching FPV pairs.

11. The system of claim 10, wherein determining the main axis of the source drawing and the main axis of the target drawing comprises, for each of the source drawing and the target drawing:
generating an angle-count barcode based on a number of lines associated with each angle; and
determining the main axis based at least in part on the angle-count barcode.

12. The system of claim 11, wherein determining the main axis of the source drawing and the main axis of the target drawing comprises, for each of the source drawing and the target drawing:
generating an angle-length barcode based on a total length of lines associated with each angle; and
determining the main axis based at least in part on the angle-length barcode.

13. The system of claim 10, wherein aligning the main axis of the source drawing to the main axis of the target drawing comprises:
rotating the source drawing until the main axis of the source drawing becomes aligned with the main axis of the target drawing.

14. The system of claim 10, wherein determining the predetermined number of matching FPV pairs across the source drawing and the target drawing comprises:
determining a type of each of the plurality of source FPVs; and
determining a number of source FPVs associated with each type.

15. The system of claim 14, wherein determining the predetermined number of matching FPV pairs across the source drawing and the target drawing further comprises:
determining a least common type of source FPVs based on the determined number of source FPVs associated with each type; and
matching a predetermined number of source FPVs to a predetermined number of target FPVs,
wherein the matching starts from the least common type of source FPVs.

16. The system of claim 14, wherein the type of each of the plurality of source FPVs is defined by one or more angles associated with the respective source FPV.

17. The system of claim 10, wherein aligning the source drawing with the target drawing based on the matching FPV pairs comprises:
- determining a transformation matrix based on the matching FPV pairs; and
- aligning the source drawing with the target drawing based on the transformation matrix.

18. At least one non-transitory computer readable medium for automatically aligning drawings, the at least one non-transitory computer readable medium storing instructions which, when executed by one or more processors, cause the one or more processors to perform operations comprising:
- receiving a source drawing and a target drawing;
- determining a main axis of the source drawing and a main axis of the target drawing;
- aligning the main axis of the source drawing to the main axis of the target drawing;
- generating a plurality of source feature point vectors (FPVs) from the source drawing and a plurality of target FPVs from the target drawing;
- determining a predetermined number of matching FPV pairs across the source drawing and the target drawing by determining a type of each of the plurality of source FPVs and determining a number of source FPVs associated with each type; and
- aligning the source drawing with the target drawing based on the matching FPV pairs.

* * * * *